(12) United States Patent
Park et al.

(10) Patent No.: US 8,669,794 B2
(45) Date of Patent: Mar. 11, 2014

(54) CIRCUIT FOR DETECTING A VOLTAGE CHANGE USING A TIME-TO-DIGITAL CONVERTER

(75) Inventors: Sang Wook Park, Seoul (KR); Ashwin Raghunathan, Mountain View, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 13/401,296

(22) Filed: Feb. 21, 2012

(65) Prior Publication Data

US 2013/0214831 A1 Aug. 22, 2013

(51) Int. Cl.
*H03L 7/06* (2006.01)

(52) U.S. Cl.
USPC .................. 327/156; 327/147; 327/530

(58) Field of Classification Search
USPC .................................. 327/147, 156
See application file for complete search history.

(56) References Cited

U.S. PATENT DOCUMENTS

| | | | |
|---|---|---|---|
| 6,411,142 B1 * | 6/2002 | Abbasi et al. | 327/156 |
| 6,922,111 B2 | 7/2005 | Kurd et al. | |
| 7,667,529 B2 * | 2/2010 | Consuelo et al. | 327/536 |
| 7,667,633 B2 | 2/2010 | Choi et al. | |
| 7,932,757 B2 | 4/2011 | Raghunathan et al. | |
| 7,940,097 B2 | 5/2011 | Chen | |
| 8,204,107 B2 * | 6/2012 | Zhuang et al. | 375/240 |
| 8,284,886 B2 * | 10/2012 | Staszewski et al. | 375/376 |
| 2003/0210028 A1 * | 11/2003 | Beach et al. | 324/76.16 |
| 2004/0146132 A1 * | 7/2004 | Staszewski et al. | 375/376 |
| 2004/0183613 A1 | 9/2004 | Kurd et al. | |
| 2006/0244649 A1 | 11/2006 | Terazawa et al. | |
| 2007/0030044 A1 * | 2/2007 | Lutkemeyer | 327/158 |
| 2009/0079508 A1 * | 3/2009 | Tsuda | 331/1 A |
| 2009/0225631 A1 | 9/2009 | Shimizu et al. | |
| 2010/0277211 A1 | 11/2010 | Geng et al. | |
| 2011/0074398 A1 | 3/2011 | Barton et al. | |
| 2011/0187433 A1 | 8/2011 | Baumann et al. | |
| 2011/0309888 A1 * | 12/2011 | Bulzacchelli et al. | 331/109 |
| 2012/0307866 A1 * | 12/2012 | Chen | 374/170 |
| 2012/0313678 A1 * | 12/2012 | Felix | 327/156 |
| 2013/0043920 A1 * | 2/2013 | Lee et al. | 327/159 |
| 2013/0058437 A1 * | 3/2013 | Oshima et al. | 375/316 |

OTHER PUBLICATIONS

Arai, et al., "A CMOS Time to Digital Converter VLSI for High-Energy Physics," IEEE 1988 Symposium on VLSI Circuits, pp. 121-122, 1988.
Dudek, et al., "A High-Resolution CMOS Time-to-Digital Converter Utilizing a Vernier Delay Line," IEEE Transactions on Solid-State Circuits, vol. 35, No. 2, pp. 240-247, Feb. 2000.

(Continued)

*Primary Examiner* — Adam Houston
(74) *Attorney, Agent, or Firm* — William M. Hooks

(57) ABSTRACT

A circuit for detecting a voltage change is described. The circuit includes a supply insensitive pulse generator that generates a pulse signal. The circuit also includes a time-to-digital converter coupled to the supply insensitive pulse generator. The time-to-digital converter generates a digital signal based on the pulse signal and a voltage. The circuit also includes a controller coupled to the time-to-digital converter that detects a voltage change based on the digital signal.

30 Claims, 15 Drawing Sheets

(56) References Cited

OTHER PUBLICATIONS

Jiao, et al., "A Programmable Adaptive Phase-Shifting PLL for Close Data Compensation Under Resonant Supply Noise," ISSCC 2011, Session 15, High-Performance SoCs & Components, 15.5, 2011 IEEE International Solid-State Circuits Conference, pp. 272-274, 2011.

Kurd N., et al., "Next Generation Intel® Micro-architecture (Nehalem) Clocking Architecture," Symposium on VLSI Circuits Digest of Technical Papers, 2008, 62-63.

Lee, et al., "A 9b, 1.25 ps. Resolution Coarse-Fine Time-to-Digital Converter in 90 nm CMOS that Amplifies a Time Residue," IEEE Journal of Solid-State Circuits, vol. 43, No. 4, pp. 769-777, Apr. 2008.

Staszewski, et al., "1.3 V 20ps time-to-digital converters for frequency synthesis in 90-nm CMOS," IEEE Transactions on Circuits and Systems-II: Exxpress Briefs, vol. 53, No. 3, pp. 220-224, Mar. 2006.

Bowman, et al., Dynamic variation monitor for measuring the impact of voltage droops on microprocessor clock frequency, Custom Integrated Circuits Conference (CICC), 2010 IEEE; Publication Year: 2010, pp. 1-4.

International Search Report and Written Opinion—PCT/US2013/027194—ISA/EPO—Jul. 8, 2013.

\* cited by examiner

CIRCUIT FOR DETECTING A VOLTAGE CHANGE USING A TIME-TO-DIGITAL CONVERTER

TECHNICAL FIELD

The present disclosure relates generally to electronic devices. More specifically, the present disclosure relates to a circuit for detecting a voltage change using a time-to-digital converter.

BACKGROUND

Electronic devices have become a part of everyday life. Examples of electronic devices include circuits, integrated circuits, cellular telephones, smartphones, wireless modems, computers, digital music players, Global Positioning System (GPS) units, Personal Digital Assistants, gaming devices, etc. Electronic devices can be used in a wide variety of contexts. For example, electronic devices can be used in everything from automobiles to housing locks.

The complexity of electronic devices has increased dramatically in the last few years. For example, many electronic devices have one or more processors that help control the device, as well as a number of digital circuits to support the processor and other parts of the device. Some electronic devices have also reduced in size while increasing in speed and efficiency.

Operating conditions within electronic devices may vary. For instance, voltages, currents, temperature and/or processes may vary while the electronic device is operating. As illustrated by this discussion, systems and methods that help ensure operation of an electronic device with variations in operating conditions may be beneficial.

SUMMARY

A circuit for detecting a voltage change is described. The circuit includes a supply insensitive pulse generator that generates a pulse signal. The circuit also includes a time-to-digital converter coupled to the supply insensitive pulse generator. The time-to-digital converter generates a digital signal based on the pulse signal and a voltage. The circuit also includes a controller coupled to the time-to-digital converter that detects a voltage change based on the digital signal. The supply insensitive pulse generator may generate the pulse signal based on a frequency-divided clock signal. The digital signal may include a thermometer code.

The controller may generate a droop code only when the voltage change is a voltage drop. The controller may reset the droop code if no additional voltage drop occurs within a period.

The controller may be coupled to a phase-locked loop that generates a clock signal for a processor. The controller may adjust a frequency of the clock signal based on the voltage change. The controller may adjust the frequency of the clock signal by switching off an injection signal from a slave voltage-controlled oscillator and adjusting a variable current source. The controller may generate a calibration code to adjust the pulse signal from the supply insensitive pulse generator. The controller may generate the calibration code by incrementing the calibration code until the digital signal is within a range. The controller may include a decoder that decodes the thermometer code into a 4-bit number.

A method for detecting a voltage change by a circuit is also described. The method includes generating a pulse signal by a supply insensitive pulse generator. The method also includes generating a digital signal by a time-to-digital converter based on the pulse signal and a voltage. The method further includes detecting a voltage change based on the digital signal.

A computer-program product for detecting a voltage change is also described. The computer-program product includes a non-transitory tangible computer-readable medium with instructions. The instructions include code for causing a circuit to generate a pulse signal by a supply insensitive pulse generator. The instructions also include code for causing the circuit to generate a digital signal by a time-to-digital converter based on the pulse signal and a voltage. The instructions further include code for causing the circuit to detect a voltage change based on the digital signal.

An apparatus for detecting a voltage change is also described. The apparatus includes means for generating a pulse signal that is insensitive to variations in supply voltage. The apparatus also includes means for generating a digital signal based on the pulse signal and a voltage. The apparatus further includes means for detecting a voltage change based on the digital signal.

DETAILED DESCRIPTION

Figure 1:
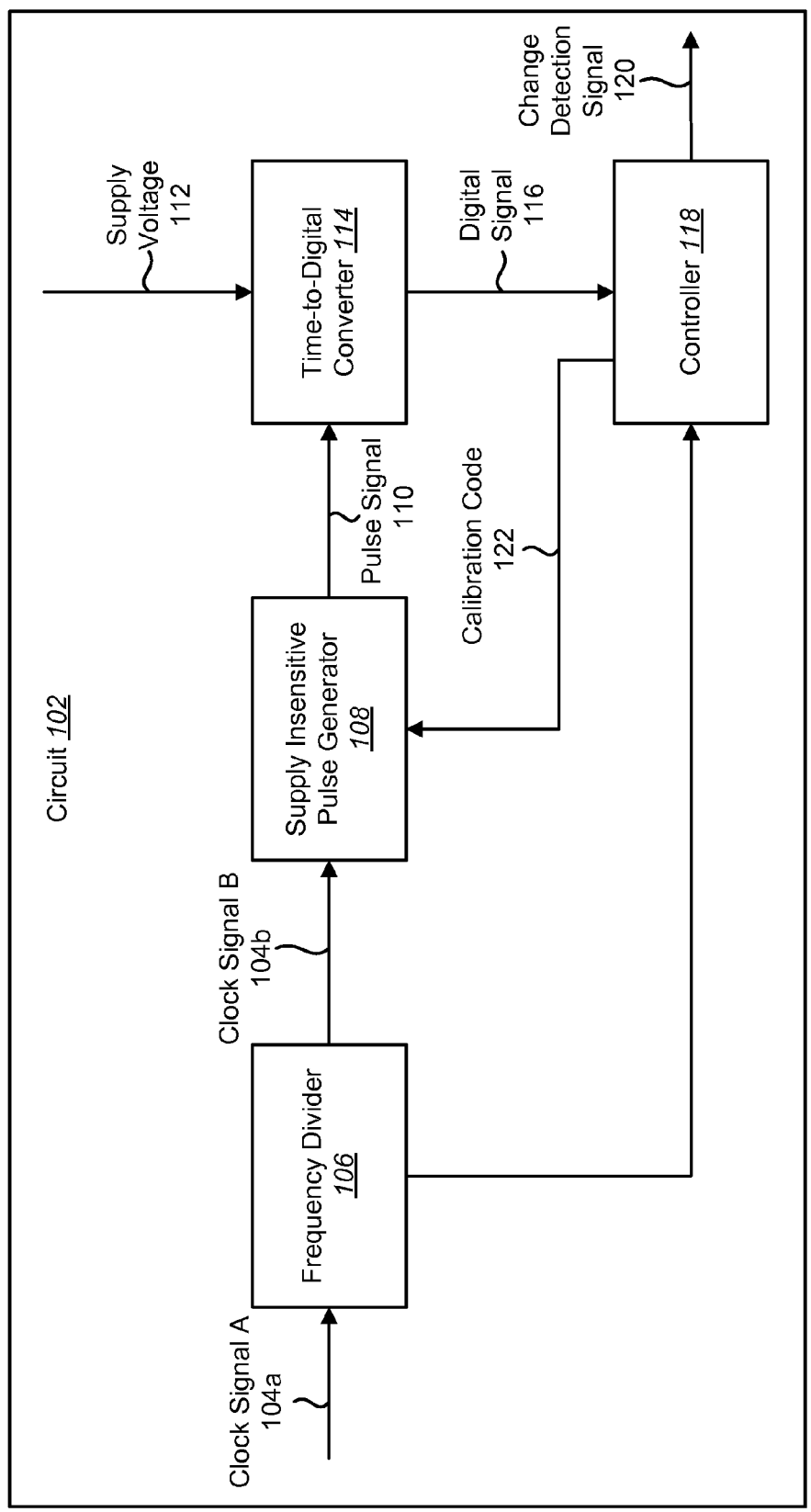
FIG. 1 is a block diagram illustrating one configuration of a circuit for detecting a voltage change using a time-to-digital converter (TDC)

Unless expressly limited by its context, the term "signal" is used herein to indicate any of its ordinary meanings, including a state of a memory location (or set of memory locations) as expressed on a wire, bus, or other transmission medium. Unless expressly limited by its context, the term "generating" is used herein to indicate any of its ordinary meanings, such as computing or otherwise producing. Unless expressly limited by its context, the term "calculating" is used herein to indicate any of its ordinary meanings, such as computing, evaluating, and/or selecting from a set of values. Unless expressly limited by its context, the term "obtaining" is used to indicate any of its ordinary meanings, such as calculating, deriving, receiving (e.g., from an external device), and/or retrieving (e.g., from an array of storage elements). Where the term "comprising" is used in the present description and claims, it does not exclude other elements or operations. The term "based on" (as in "A is based on B") is used to indicate any of its ordinary meanings, including the cases (i) "based on at least" (e.g., "A is based on at least B") and, if appropriate in the particular context, (ii) "equal to" (e.g., "A is equal to B"). Similarly, the term "in response to" is used to indicate any of its ordinary meanings, including "in response to at least."

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The term "configuration" may be used in reference to a method, apparatus, or system as indicated by its particular context. The terms "method," "process," "procedure," and "technique" are used generically and interchangeably unless otherwise indicated by the particular context. The terms "apparatus" and "device" are also used generically and interchangeably unless otherwise indicated by the particular context. The terms "element" and "module" are typically used to indicate a portion of a greater configuration. Any incorporation by reference of a portion of a document shall also be understood to incorporate definitions of terms or variables that are referenced within the portion, where such definitions appear elsewhere in the document, as well as any figures referenced in the incorporated portion.

As used herein, the term "block/module" may be used to indicate that a particular element may be implemented in hardware, software or a combination of both. The term "coupled" and variations thereof may be used to indicate that one entity is directly or indirectly connected to another entity. For example, if a first entity is coupled to a second entity, the first entity may be connected directly to the second entity or may be indirectly connected to the second entity through another entity.

The systems and methods disclosed herein describe a circuit for detecting a voltage change using a time-to-digital converter (TDC). For example, the systems and methods disclosed herein may be used to implement a power supply voltage droop sensor with a TDC (time-to-digital converter). A power supply voltage droop sensor may monitor voltage variation on a power supply and may generate digital codes corresponding to the current voltage level. For instance, a voltage droop sensor or voltage sensing circuit may be implemented using a time-to-digital converter (TDC) with a control block (e.g., controller) that generates a (changed) digital code only when the supply voltage drops (and when reset, for example). In one configuration, a phase-locked loop (PLL) frequency may need to be adjusted with supply voltage changes. For instance, it may be beneficial for a PLL to respond to a supply voltage drop. Thus, a PLL may constantly receive digital codes from the power supply droop sensor and may be able to adjust its operating frequency when there is a power supply voltage drop (e.g., when indicated by a large digital code variation).

Other approaches in the art have been used to track voltage. In one approach (e.g., an adaptive phase-shift PLL architecture), voltage supply tracking is done by modulating voltage controlled oscillator (VCO) control voltages with a filtered version of supply voltage. In this approach, a transfer function from a supply voltage to a control voltage has one zero and one pole (yielding a high-pass filter, for example). By adjusting capacitances and some transistors, the magnitude and phase response of the control voltage to supply voltage can be configurable. This approach provides an analog approach to supply tracking. This may only provide limited control on the control voltage depending on a supply noise profile.

In another prior approach, a linear voltage regulator (LVR) generates a PLL voltage that is compared with a supply voltage. With a control loop of the PLL voltage, the PLL voltage tracks the supply voltage. This approach provides first order supply tracking. The PLL output frequency is modulated in response to variations in processor digital supply. For instance, a processor may draw high current (causing large supply droop) when it changes to a high activity mode and the PLL may lower its frequency in response to supply droop to prevent processor failure.

In one configuration of the systems and methods disclosed herein, a supply droop sensor detects a supply voltage change using a time-to-digital converter (TDC) and a supply insensitive pulse generator. This configuration allows flexibility in implementing a calibration and control circuit. This approach may provide no response to a supply voltage overshoot. A reference voltage level may be reset if a voltage level is not changed for a given time. A supply voltage mapping to a code can be calibrated.

In this configuration, a (supply insensitive) pulse generator generates a voltage insensitive pulse width. The time-to-digital converter (TDC) may convert the pulse width into a digital code or signal that varies with supply voltage. The digital signal (e.g., the TDC decoder output) may be processed by a controller.

Calibration logic in the controller may calibrate process and temperature variation effects of the voltage insensitive pulse width based on the TDC outputs. For example, a pulse width generation setting may be adjusted to place the TDC outputs within a particular range (e.g., where decision logic uses four bits ranging from '0000' to '1111' to represent values 0-15). Calibration may be started whenever control logic changes its reference voltage level.

An example of one implementation of the systems and methods is given hereafter. For instance, a circuit may be implemented as a voltage droop sensor. The overall floor plan of the voltage droop sensor may comprise a reference clock divider, a pulse generator, a time-to-digital converter (TDC) decoder and decision logic (e.g., a controller). The clock divider provides an option to operate the voltage droop sensor at a low frequency. The output of the clock divider may be used as a global clock for the voltage droop sensor.

The pulse generator generates a voltage insensitive pulse width every clock cycle. The pulse and its complement may drive the time-to-digital converter (TDC) decoder. The time-to-digital converter (TDC) decoder converts a current voltage level to 26-bit "thermometer" codes. The decision logic may monitor the thermometer codes continuously and generate a droop signal along with 3-bit droop codes when a voltage droop occurs, followed by a change in the thermometer codes.

The time-to-digital converter (TDC) may be used to sense voltage droop. In other words, the time-to-digital converter (TDC) may operate as a voltage droop sensor. It should be noted that time-to-digital converter (TDC) structures have been used in digital phase-locked loops (PLLs) to compare the phase of two input signals and generate digital codes corresponding to the phase difference.

A voltage insensitive pulse generated from the pulse generator may be divided into two signals. One of the input signals propagates through delay chains (in the TDC), and the other signal is inverted and used as a latching clock. To operate as a voltage droop sensor, the pulse and its inversion are used as two time-to-digital converter (TDC) input signals. Therefore, the time-to-digital converter (TDC) will generate a sequence of ones followed by a sequence of zeros. The transition position of one to zero happens where the sum of the inverter chain delay becomes the input pulse width (approximately).

The response of the time-to-digital converter (TDC) may vary based on the supply voltage level. For instance, the digital code outputs from the time-to-digital converter (TDC) at two different power supply voltage levels may be different. For example, when the power supply voltage is high, the delay of the inverter cells is small. Therefore, it requires more inverter cells to have the sum of the inverter delay to become the input pulse width. However, when power supply voltage is low, the delay of the inverter(s) is large, and only few inverter cells are required to have the same amount of delay (according to the pulse width). Therefore, the difference of the "thermometer" codes indicates the variation of the power supply voltage. The variation of the power supply voltage may be interpreted as a droop code generated by the decision logic (e.g., controller). In one configuration, a droop code may have a value of 4 (e.g., bits '100'). A PLL may use the droop code as an indication of the power supply voltage drop and adjust its operating frequency accordingly.

In some configurations, the (supply voltage insensitive) pulse generator may be calibrated according to a calibration procedure. In one configuration, the decision logic (e.g., controller) internally uses 4-bit numbers that correspond to values 0-15. Calibration logic (in the controller, for example) tries to maintain a time-to-digital converter (TDC) decoder output within this range by adjusting the configuration of pulse width generator. For example, the calibration procedure tries to exclude 0 and 1 for the margin on the lower number side. The calibration logic may cycle a calibration code until the time-to-digital converter (TDC) decoder output is within 2 to 15. More detail on the calibration procedure is given below.

As described above, the time-to-digital converter (TDC) may be used as a supply droop sensor. When a voltage is changed, the time-to-digital converter (TDC) decoder generates the digital signal or "thermometer" code corresponding to its 1-to-0 transition position. The thermometer code may be increased (indicating a longer delay, for example) as supply voltage is decreased. The decision logic may generate the droop code only when the supply voltage drops (e.g., when the time-to-digital converter (TDC) decoder code is increased). In some configurations, if voltage is increased, the droop code is not changed and may maintain its previous code. If there is not another supply voltage drop (e.g., an additional voltage drop) for a certain time (e.g., period), then the decision logic may reset the droop code. In this way, a PLL may react only to a supply voltage drop rather than supply voltage transients.

In some configurations, the droop code may be applied to a phase-locked loop (PLL). For instance, a PLL may include two voltage-controlled oscillators (VCOs). A "master" VCO may be included in a loop controlled by the PLL. In one example of the systems and methods disclosed herein, when a droop code is '000', a "slave" VCO is the same frequency as the master VCO with an injection (e.g., injection signal) from the master VCO. If the droop code becomes non-zero, then the injection (e.g., injection signal) from master VCO may be disabled (switched off) and the frequency of the slave VCO may be controlled by the droop code.

In comparison to other approaches, the architecture provided by the systems and methods disclosed herein may reduce a PLL frequency only with supply droops, not with overshoots. This may be beneficial, since the PLL may be used to clock multiple digital blocks that are all rated for a certain maximum frequency, while some of these blocks may be on a different supply (than a high performance central processing unit (CPU), for example). So, when the PLL drops its frequency in response to a droop on the CPU supply, these blocks may not be affected. However, if the PLL responds to an overshoot on the CPU supply and bumps its frequency above the maximum frequency, then these other blocks could fail. The systems and methods disclosed herein may also use an injection locked master-slave VCO arrangement in combination with the TDC droop detector to ensure that the slave oscillator relocks to the master with no overshoot after the droop event has passed. In other approaches, the PLL will try to relock to the reference clock once the supply transient has passed and there may be an overshoot in PLL frequency based on the PLL loop dynamics.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of a circuit 102 for detecting a voltage change using a time-to-digital converter (TDC). The circuit 102 may include one or more of a frequency divider 106, a supply insensitive pulse generator 108, a time-to-digital converter (TDC) 114 and a controller 118. The circuit 102 and/or one or more components of the circuit 102 (e.g., the frequency divider 106, supply insensitive pulse generator 108, time-to-digital converter (TDC) 114 and/or controller 118) may be implemented in hardware, software or a combination of both. For example, the circuit 102 and/or one or more of its components may comprise circuit components (e.g., resistors, capacitors, inductors, transistors, amplifiers, buffers, etc.), memory cells, latches, registers, logic gates, etc. Additionally or alternatively, the circuit 102 may be implemented as an integrated circuit, as an application-specific integrated circuit (ASIC) and/or using a processor and instructions. In some configurations, the circuit 102 may be included within an electronic device (e.g., cellular phone, smartphone, audio player, television, computer, etc.).

The circuit 102 may receive or obtain clock signal A 104*a*. Clock signal A 104*a* may be received from a voltage controlled oscillator (VCO) or some other clock generator. In one configuration, the frequency divider 106 may divide the frequency of clock signal A 104*a* to produce clock signal B 104*b*. In other words, clock signal B 104*b* may be a frequency-divided clock signal. In this case, clock signal B 104*b* may have a frequency that is reduced in comparison with clock signal A 104*a*. In other configurations, the circuit 102 may not include a frequency divider 106 or the frequency divider 106 may not reduce the frequency of clock signal A 104*a* or may be bypassed. In this case, clock signal B 104*b* is the same as clock signal A 104*a*. Clock signal B 104*b* may be the clock signal used by other components (e.g., the supply insensitive pulse generator 108 and the controller 118) of the circuit 102, for example.

Clock signal B 104b may be provided to the supply insensitive pulse generator 108 and the controller 118. The supply insensitive pulse generator 108 may generate a pulse signal 110 based on clock signal B 104b. For example, the supply insensitive pulse generator 108 may generate a pulse width in the pulse signal 110 at each cycle of clock signal B 104b. The pulse signal 110 generated by the supply insensitive pulse generator 108 may be insensitive to variations in supply voltage. For example, variations in supply voltage may not significantly affect the functioning of the supply insensitive pulse generator 108 or may affect it less than other blocks. In other words, the pulse signal 110 may remain relatively consistent or regular even when a supply voltage varies. In some configurations, the pulse width of the pulse signal 110 may be adjusted or calibrated based on a calibration code 122. More detail on this adjustment or calibration is given below.

The pulse signal 110 may be provided to the time-to-digital converter (TDC) 114. The time-to-digital converter (TDC) 114 may generate a digital signal 116 based on the pulse signal 110 and a supply voltage 112. The digital signal 116 may vary based on variations in the supply voltage 112. For example, the time-to-digital converter (TDC) may include a chain of voltage-sensitive buffers. The higher the supply voltage 112, the faster the voltage-sensitive buffers respond. For instance, the pulse signal 110 may propagate more quickly through the voltage-sensitive buffer chain when the supply voltage 112 is higher.

The digital signal 116 may reflect or provide an indication of the supply voltage 112 level. In one configuration, the digital signal 116 is a "thermometer" signal or code. For example, the digital signal 116 may include 26 bits. In one example, the bits may include a series of "1" bits followed by a series of "0" bits. The position of the transition from 1 s to 0s in the digital signal 116 may reflect the supply voltage 112 level. For example, when the supply voltage 112 is high, the delay of inverter cells in the time-to-digital converter (TDC) is small. Therefore, it requires more inverter cells to have the sum of the inverter delay to become the pulse width of the pulse signal 110. However, when the supply voltage 112 is low, the delay of the inverters is large, and only few inverter cells are required to have the same amount of delay (according to the pulse width). Therefore, the difference of the "thermometer" signal (e.g., digital signal 116) indicates the variation of the supply voltage 112.

The digital signal 116 is provided to the controller 118. The controller 118 may generate a change detection signal 120 based on the digital signal 116. For example, the controller 118 may monitor the digital signal 116 and produce a change detection signal 120 when the digital signal 116 indicates a change in the supply voltage 112. In some configurations, the change detection signal 120 may only indicate when a drop in supply voltage 112 has occurred (and when a reset occurs, for example). For instance, the change detection signal 120 may indicate a "droop code" generated by the controller 118 when the digital signal 116 indicates a drop in supply voltage 112. If another (e.g., additional) drop in supply voltage 112 does not occur for a certain period, if the drop in supply voltage 112 does not persist for a certain period and/or if the supply voltage 112 returns to a particular voltage for a certain period, the controller 118 may reset the change detection signal 120. This may indicate that the supply voltage 112 droop has ended.

In one example of the systems and methods disclosed herein, the change detection signal 120 (e.g., droop code) may be provided to a phase-locked loop (PLL). For instance, the droop code may cause a voltage-controlled oscillator (VCO) to lower its cycle frequency based on the drop in supply voltage 112. This may be done in order to ensure that circuitry that is powered by the supply voltage 112 may still function properly when the supply voltage 112 drops. For example, the supply voltage 112 may power a processor. The processor may not be able to function properly at a particular (higher) frequency when the supply voltage 112 drops. Thus, the change detection signal 120 may be used to lower the frequency of a PLL that supplies a clock signal to the processor. This may allow the processor to function properly at a lower frequency when a droop in the supply voltage 112 occurs.

In some configurations, the controller 118 may also generate a calibration code 122 to calibrate the supply insensitive pulse generator 108. For example, the controller 118 may internally use 4-bit numbers to perform operations. A 4-bit number may correspond to values in a range between 0 and 15. The controller 118 may attempt to maintain the digital signal 116 within this range by adjusting or calibrating the supply insensitive pulse generator 108. In one configuration, the controller 118 may attempt to exclude values 0 and 1 on the lower number side. For example, the controller 118 may cycle a calibration code 122 until the digital signal 116 is within a value range of 2 to 15. The controller 118 may calibrate the supply insensitive pulse generator 108 whenever the controller 118 changes a reference voltage level.

Figure 2:
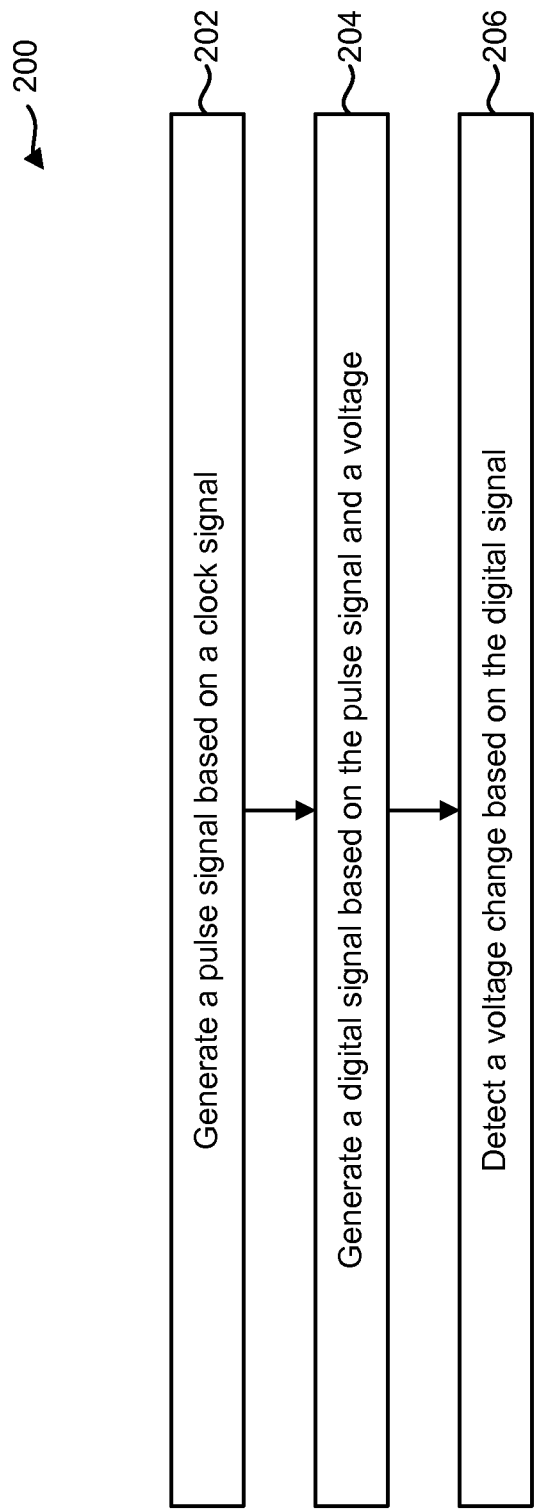
FIG. 2 is a flow diagram illustrating one configuration of a method for detecting a voltage change.

FIG. 2 is a flow diagram illustrating one configuration of a method 200 for detecting a voltage change. The circuit 102 may generate 202 a pulse signal 110 based on a clock signal 104. For example, the supply insensitive pulse generator 108 may generate a pulse width in the pulse signal 110 at each cycle of clock signal B 104b.

The circuit 102 may generate 204 a digital signal 116 based on the pulse signal 110 and a voltage 112. For example, the time-to-digital converter (TDC) 114 may generate a digital signal 116 (e.g., a "thermometer" signal or code) based on the pulse signal 110 and the supply voltage 112. As described above, the digital signal 116 may indicate or reflect variations in the supply voltage 112.

The circuit 102 may detect 206 a voltage change (e.g., a change in the supply voltage 112) based on the digital signal 116. For example, the controller 118 may detect when the digital signal 116 represents a longer delay (and hence, a lower supply voltage 112) than was previously indicated. For instance, if the digital signal 116 provides a higher number in a current cycle compared to a lower number in a previous cycle, the controller 118 may detect that a drop in supply voltage 112 has occurred. In some configurations, the circuit 102 may provide a change detection signal 120 (e.g., a droop signal or code) based on the detected voltage change.

Figure 3:
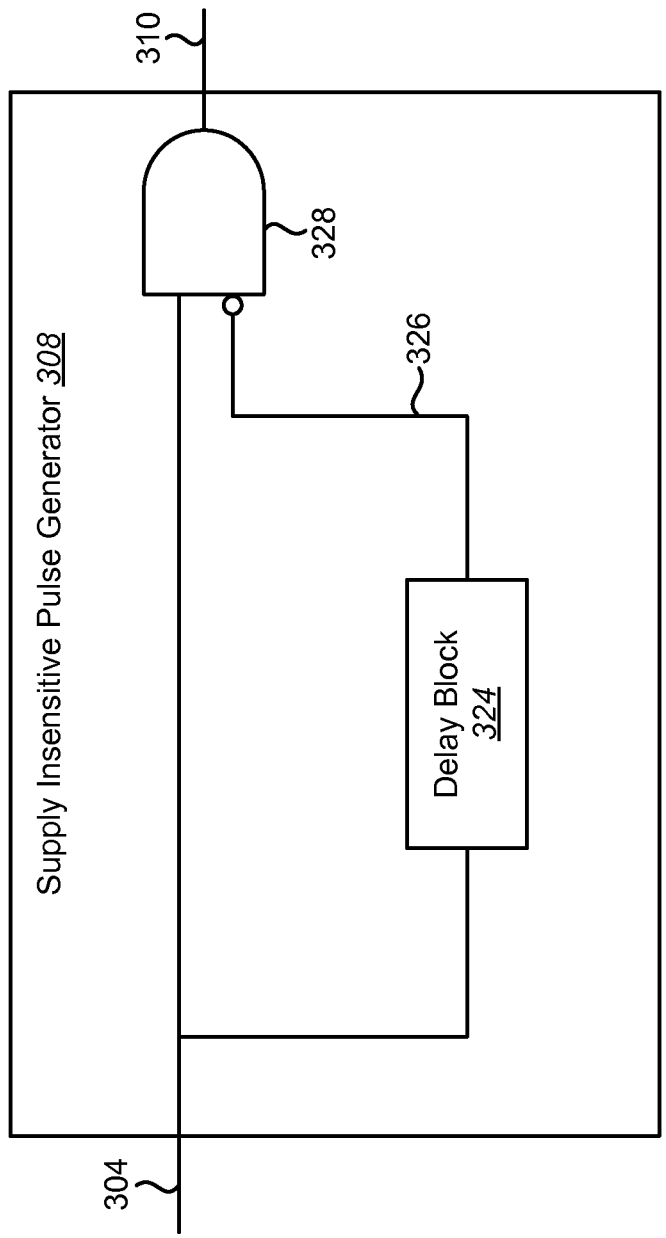
FIG. 3 is a block diagram illustrating one configuration of a supply insensitive pulse generator.

FIG. 3 is a block diagram illustrating one configuration of a supply insensitive pulse generator 308. The supply insensitive pulse generator 308 illustrated in FIG. 3 may be one example of the supply insensitive pulse generator 108 illustrated in FIG. 1. As illustrated in FIG. 3, the supply insensitive pulse generator 308 may include a delay block 324 and an AND gate 328.

The supply insensitive pulse generator 308 may receive a clock signal 304. The clock signal 304 may be provided to the delay block 324 and to the AND gate 328. The delay block 324 may delay the clock signal 304, resulting in a delayed signal 326. The delayed signal 326 may be a version of the clock signal 304 that is delayed in time. This delayed signal 326 may be inverted before being provided to the AND gate 328.

The AND gate 328 may produce a pulse signal 310 based on the clock signal 304 and the inverted delayed signal 326. The pulse signal 310 may have a pulse width corresponding to the amount of delay provided by the delay block 324. The amount of delay provided by the delay block 324 may be adjusted or calibrated. It should be noted that the pulse signal 310 may not vary (or may vary relatively less than other circuit 102 components) based on a supply.

Figure 4:
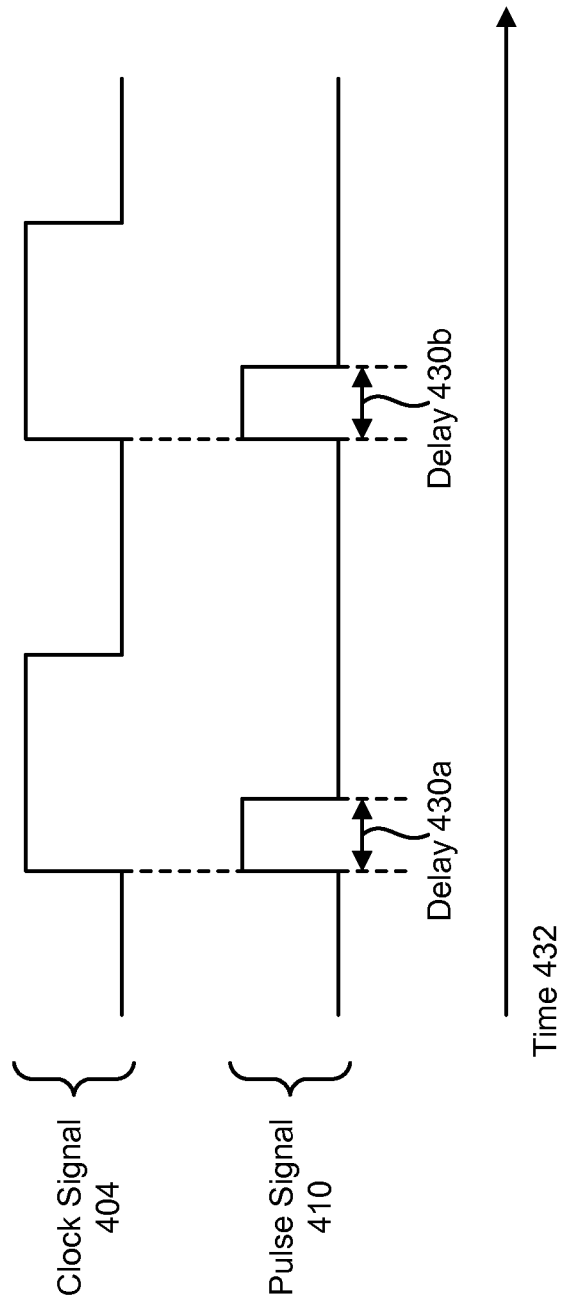
FIG. 4 is a graph illustrating the functionality of one configuration of a supply insensitive pulse generator.

FIG. 4 is a graph illustrating the functionality of one configuration of a supply insensitive pulse generator. In particular, FIG. 4 illustrates a clock signal 404 in relation to a pulse signal 410 over time 432. In one example, the pulse width of the pulse signal 410 may be 50 picoseconds (ps) out of a 2000 ps period. The clock signal 404 may be provided to a supply insensitive pulse generator (e.g., supply insensitive pulse generator 108, 308), which may provide the pulse signal 410 in response.

As illustrated in FIG. 4, the pulse width of the pulse signal 410 may correspond to a delay 430a-b. For example, the amount of delay 430a-b (provided by a delay block 324, for instance) determines the width of the pulse signal 410. The pulse signal 410 "width" may refer to the duration of each stepped-up portion of the pulse signal 410.

Figure 5:
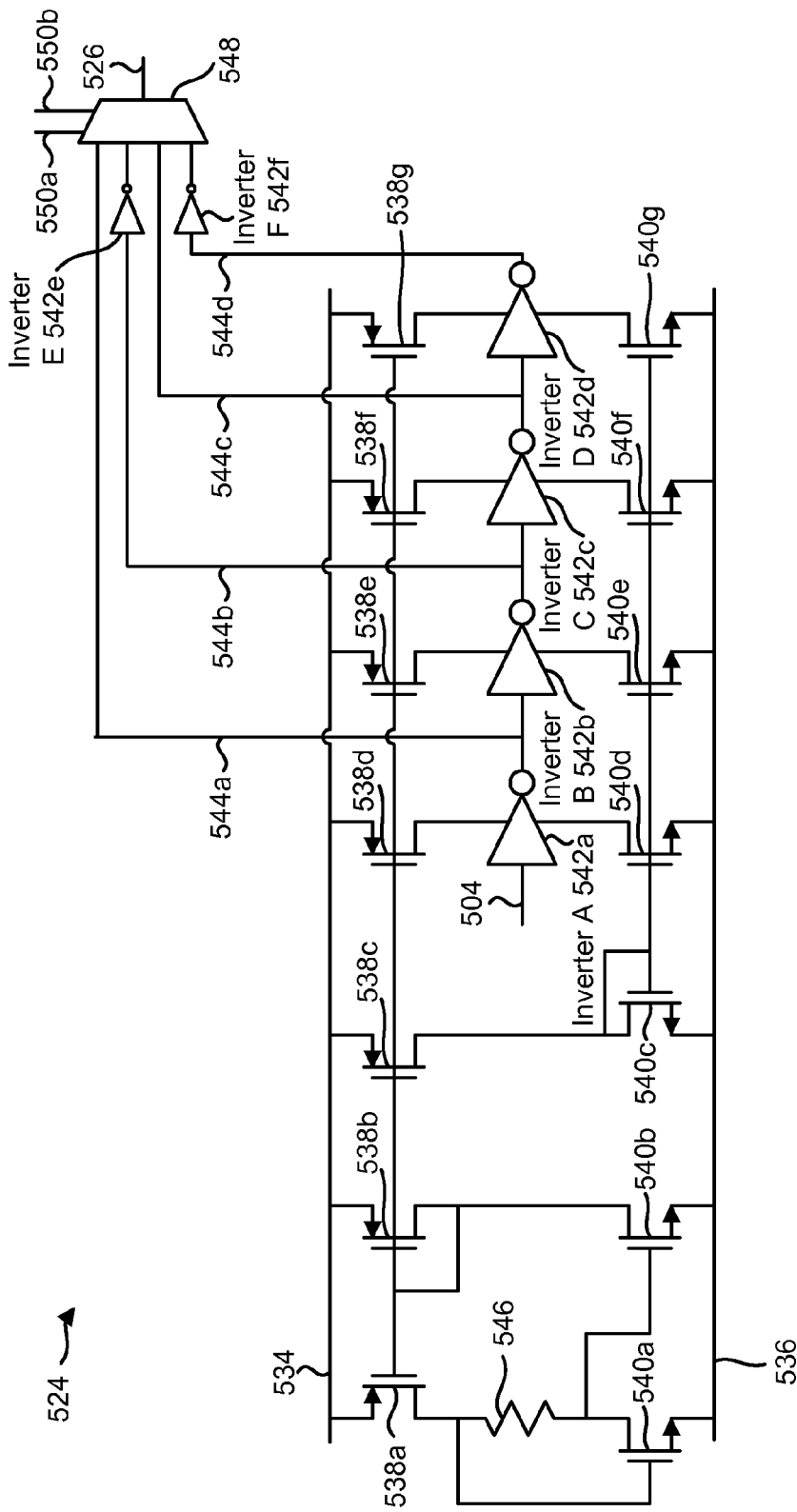
FIG. 5 is a circuit diagram illustrating one configuration of a delay block.

FIG. 5 is a circuit diagram illustrating one configuration of a delay block 524. In this configuration, the delay block 524 includes p-channel metal-oxide-semiconductor field-effect transistors (MOSFETs) 538a-g (e.g., "PMOS transistors" 538a-g), n-channel MOSFETs 540a-g (e.g., "NMOS transistors" 540a-g), a resistor 546, inverters 542a-f and a multiplexer 548.

A first voltage 534 may be applied at the sources of the PMOS transistors 538a-g. In some configurations, the first voltage 534 may be the same voltage that is supplied to a processor (e.g., CPU). The sources of the PMOS transistors 538a-g may be coupled together. A second voltage 536 may be applied at the sources of the NMOS transistors 540a-g. In some configurations, the second voltage 536 may be ground or 0 volts (V). The sources of the NMOS transistors 540a-g may be coupled together.

The drain of the first PMOS transistor 538a may be coupled to the resistor 546 and to the gate of the first NMOS transistor 540a. The drain of the first NMOS transistor 540a may be coupled to the resistor 546 and to the gate of the second NMOS transistor 540b. The gate of the first PMOS transistor 538a may be coupled to the gates of the other PMOS transistors 538b-g, to the drain of the second PMOS transistor 538b and to the drain of the second NMOS transistor 540b.

The gate of the third NMOS transistor 540c may be coupled to the gates of the fourth through seventh NMOS transistors 540d-g, to the drain of the third NMOS transistor 540c and to the drain of the third PMOS transistor 538c. Inverter A 542a may be coupled to the drain of the fourth PMOS transistor 538d and to the drain of the fourth NMOS transistor 540d. Inverter B 542b may be coupled to the drain of the fifth PMOS transistor 538e and to the drain of the fifth NMOS transistor 540e. Inverter C 542c may be coupled to the drain of the sixth PMOS transistor 538f and to the drain of the sixth NMOS transistor 540f. Inverter D 542d may be coupled to the drain of the seventh PMOS transistor 538g and to the drain of the seventh NMOS transistor 540g.

The input of inverter A 542a may receive a clock signal 504. The output 544a of inverter A 542a may be coupled to the multiplexer 548 and to the input of inverter B 542b. The output 544b of inverter B 542b may be coupled to the input of inverter C 542c and to inverter E 542e, which in turn is coupled to the multiplexer 548. The output 544c of inverter C 542c may be coupled to the multiplexer 548 and to the input of inverter D 542d. The output 544d of inverter D 542d may be coupled to inverter F 542f, which in turn is coupled to the multiplexer 548.

The multiplexer 548 may receive control signals 550a-b. The control signals 550a-b may be one example of the calibration code 122 illustrated in FIG. 1. The control signals 550a-b may be used to select one of the multiplexer 548 inputs (that are based on the inverter outputs 544a-d) to produce a delayed signal 526. The delayed signal 526 illustrated in FIG. 5 may be one example of the delayed signal 326 in FIG. 3. Each of the multiplexer 548 inputs may have a different amount of delay. Thus, the control signals 550a-b may be used to adjust or calibrate the width of a pulse signal (e.g., pulse signal 110, 310, 410).

As illustrated in FIG. 5, four transistors 538a-b, 540a-b and a resistor 546 may comprise a supply-insensitive bias that provides a supply-insensitive current to four inverters 542a-d. This results in less supply-sensitive delay. This may thus enable a supply insensitive pulse generator 108, 308 to provide a pulse that is insensitive to variations in supply voltage, for example.

Figure 6:
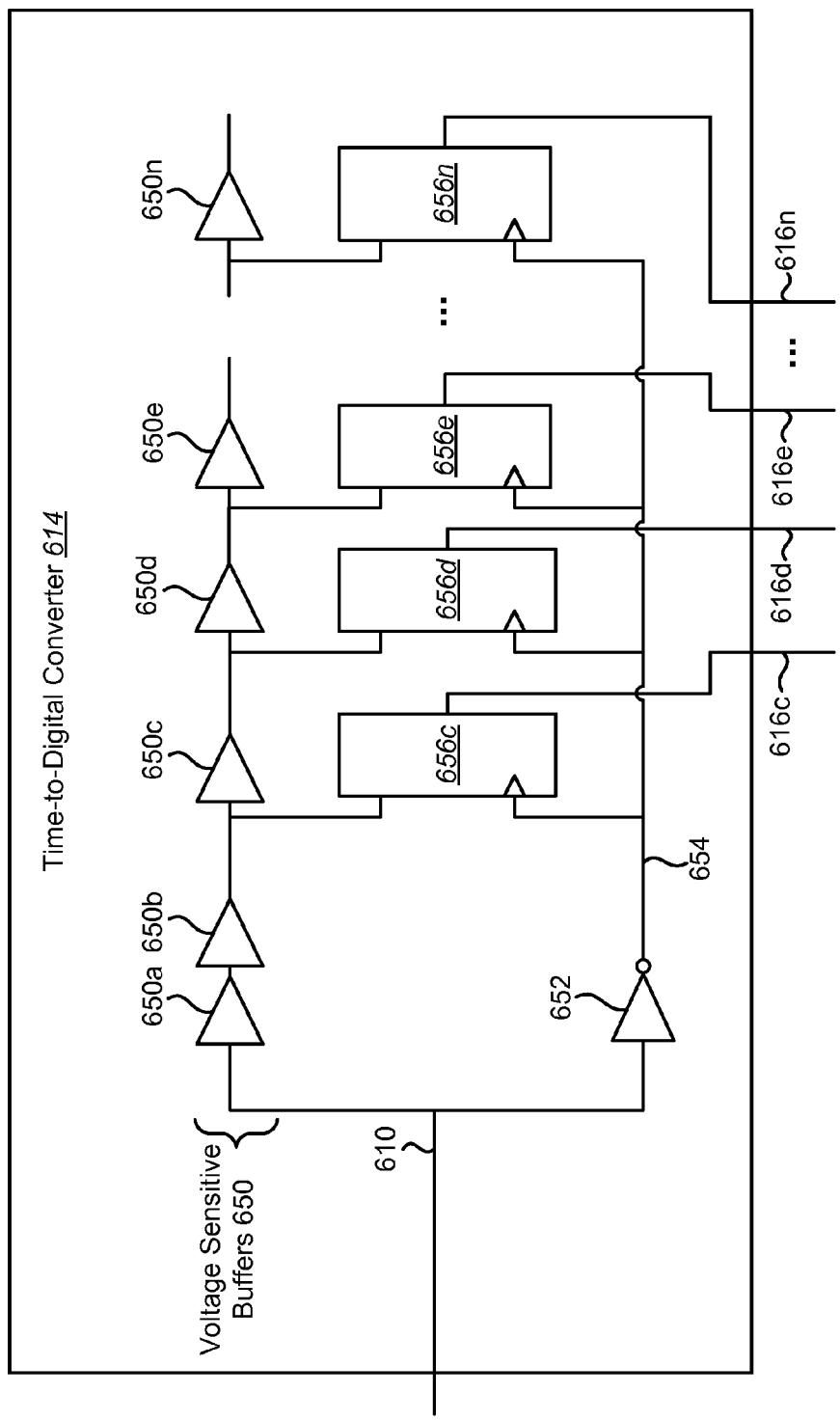
FIG. 6 is a circuit diagram illustrating one configuration of a time-to-digital converter (TDC)

FIG. 6 is a circuit diagram illustrating one configuration of a time-to-digital converter (TDC) 614. The time-to-digital converter (TDC) 614 illustrated in FIG. 6 may be one example of the time-to-digital converter (TDC) 114 illustrated in FIG. 1. The time-to-digital converter (TDC) 614 may be used to sense voltage droop.

The time-to-digital converter (TDC) 614 may include voltage sensitive buffers 650a-n, D flip-flops 656c-n and an inverter 652. The time-to-digital converter (TDC) 614 may receive a pulse signal 610 and provide a digital signal 616c-n. The pulse signal 610 may be generated by a voltage supply insensitive pulse generator (e.g., the supply insensitive pulse generator 108).

The pulse signal 610 may be provided to the chain of voltage sensitive buffers 650a-n and to the inverter 652. The inverter 652 produces a latching signal 654, which is an inverted version of the pulse signal 610. The latching signal 654 is provided to the D flip-flops 656c-n.

The pulse signal 610 propagates through the delay chain (of voltage sensitive buffers 650a-n), while the latching signal 654 is used to latch the D flip-flops 656c-n. The voltage sensitive buffers 650a-n may respond more slowly to the pulse signal 610 when provided with a lower supply voltage (not shown in FIG. 6) compared to a faster response when provided with a high supply voltage. Thus, the pulse signal 610 may propagate more slowly through the delay chain of voltage sensitive buffers 650a-n when a supply voltage drops, droops or is reduced.

Based on the pulse width of the pulse signal 610 and the supply voltage (e.g., supply voltage 112) provided to the voltage sensitive buffers 650a-n, the D flip-flops 656c may generate a sequence of ones followed by a sequence of zeros in the digital signal 616c-n. The transition position of one to zero happens where the sum of the voltage sensitive buffer 650a-n chain delay becomes the approximate width of the pulse signal 610.

Figure 7:
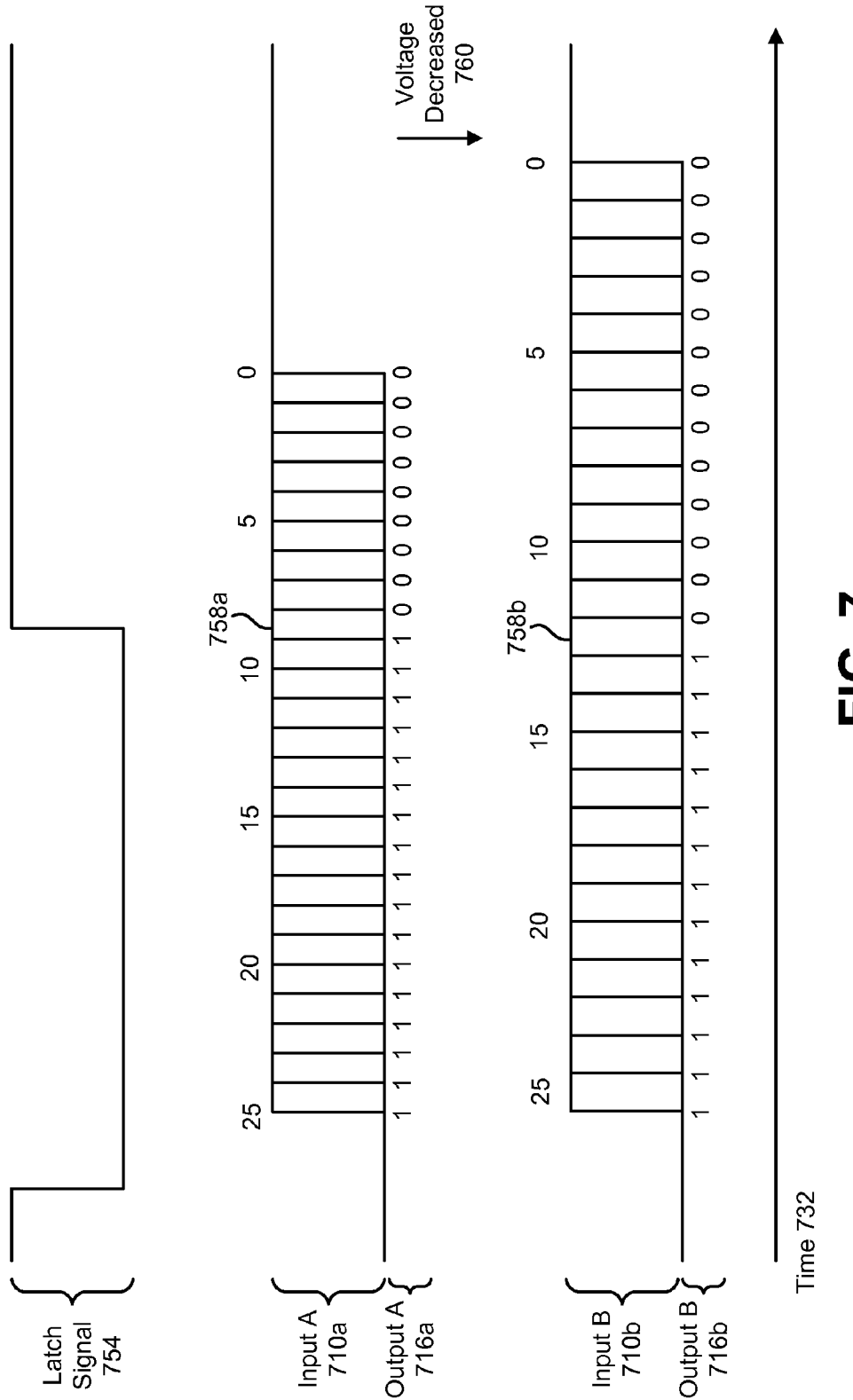
FIG. 7 is a timing diagram illustrating one example of time-to-digital converter (TDC) functionality.

FIG. 7 is a timing diagram illustrating one example of time-to-digital converter (TDC) functionality. More specifically, FIG. 7 illustrates one example of time-to-digital converter (TDC) functionality at two different supply voltages over time 732. This example illustrates a latch signal 754, input A 710a, output A 716a, input B 710b and output B 716b over time 732. The inputs 710a-b may represent a pulse signals as they propagate through voltage sensitive buffers in a time-to-digital converter (TDC), while the outputs 716a-b may represent a digital signal output from D flip-flops in the time-to-digital converter (TDC).

When power supply voltage is higher as in the plot of input A 710a, the delay of the voltage sensitive buffers (or inverter cells, for example) is small. Therefore, more voltage sensitive buffers are required to have the sum of the buffer delay become the pulse width of input A 710*a*. In this example, the first transition 758*a* from 1s to 0s in output A 716*a* may occur at a position or value of 9. However, when power supply voltage is decreased 760 as illustrated in the plot of input B 710*b*, the delay of the voltage sensitive buffers is large, and only few buffers are required to have the same amount of delay (pulse width). In this example, the second transition 758*b* from 1s to 0s in output B 716*b* may occur at a position or value of 13. Therefore, the difference of the outputs 716*a-b* (e.g., digital signals or "thermometer" codes) indicates the variation (e.g., drop) of the power supply voltage. The difference of the outputs 716*a-b* may be used to generate a droop code (e.g., change detection signal 120) generated by a controller (e.g., controller 118). In this example, the droop code will be 4 and a PLL can use the droop code as an indication of the power supply voltage drop and adjust its operating frequency accordingly.

In one example, a TDC output may be 6 (e.g., '111111111111111111111000000') at 1.05 V. This TDC output may change to 10 (e.g., '1111111111111111110000000000') at 0.95 V. In this example, the rising edge of a latch signal (similar to latch signal 754) may occur at the switch point (where the bits change from 1s to 0s, for instance).

Figure 8:
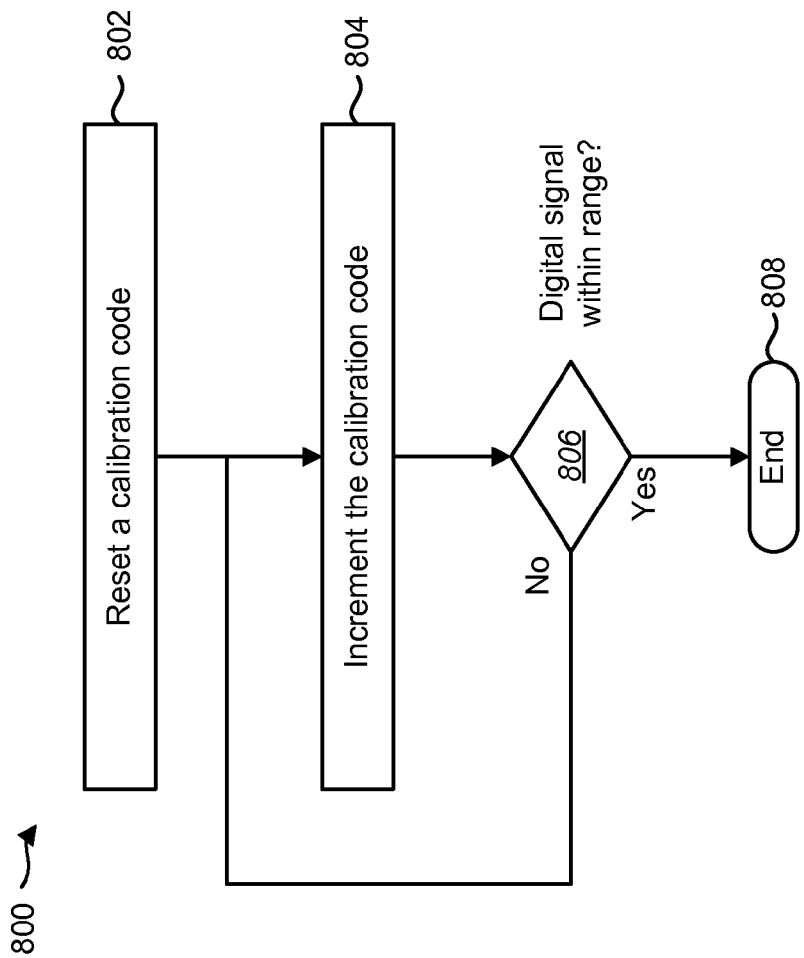
FIG. 8 is a flow diagram illustrating one configuration of a method for calibrating a supply insensitive pulse generator.

FIG. 8 is a flow diagram illustrating one configuration of a method 800 for calibrating a supply insensitive pulse generator 108. In one configuration, calibration logic in the circuit 102 (e.g., controller 118) may calibrate process and temperature variation effects of the voltage-insensitive pulse width based on the time-to-digital converter (TDC) 114 outputs. For example, a supply insensitive pulse generator 108 pulse width setting may be adjusted to place the time-to-digital converter (TDC) 114 outputs within a particular range.

In one configuration, the decision logic (e.g., controller 118) of the circuit 102 internally uses 4-bit numbers that correspond to values 0-15. The calibration logic tries to maintain a time-to-digital converter (TDC) 114 value within this range by adjusting the configuration of the supply insensitive pulse generator 108. In one example, the method 800 tries to exclude 0 and 1 for the margin on the lower number side. The circuit 102 (e.g., controller 118) may cycle a calibration code 122 until the time-to-digital converter (TDC) 114 digital signal 116 output value is within 2 to 15.

Calibration may be started whenever the circuit 102 changes a reference voltage level. The reference voltage may be a supply voltage at a time when an internal counter is overflowed. Changing the reference voltage may occur whenever the counter is overflowed. When a reference voltage level changes, the circuit 102 may reset 802 a calibration code (e.g., a supply insensitive pulse generator 108 pulse width setting). For example, the controller 118 may set a 2-bit calibration code 122 to two '1' bits (e.g., '11').

The circuit 102 may increment 804 the calibration code 122. In one configuration, the calibration code 122 may cycle through 2-bit codes '00', '01', '10', '11'. For example, the controller 118 increments 804 the calibration code 122 from '11' to '00' after reset.

The circuit 102 may determine 806 whether the digital signal 116 is within a range. In one configuration, the controller 118 internally uses 4-bit logic. Accordingly, the controller 118 may attempt to bring the digital signal 116 value within a range of 0-15. For instance, the controller 118 may determine whether 1<digital signal value<16. If the digital signal 116 value is not within the range, the circuit 102 may return to increment 804 the calibration code 122. If the digital signal 116 is within the range, then the method 800 (e.g., calibration procedure) may end 808. It should be noted that different ranges may be used, depending on the configuration.

Figure 9:
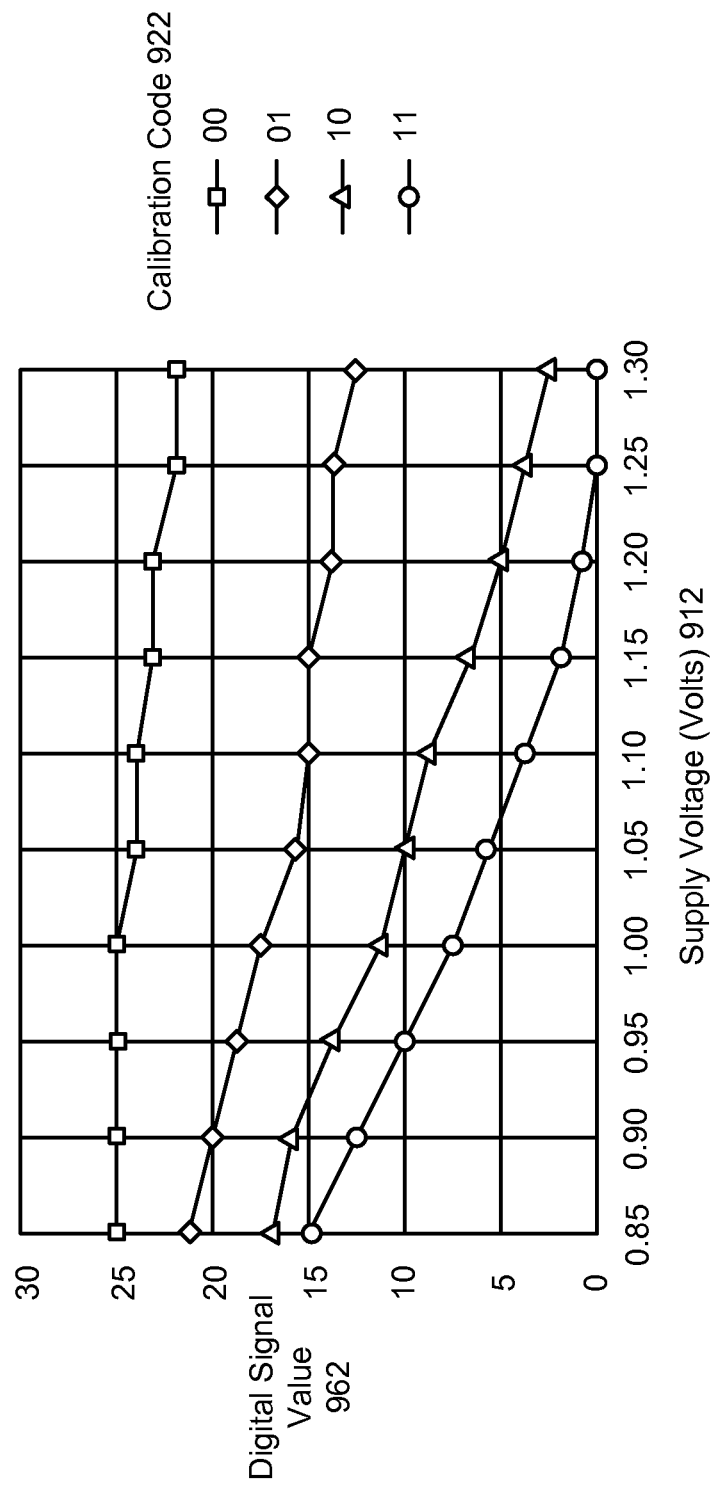
FIG. 9 is a graph illustrating one example of a digital signal value versus a supply voltage with respect to a calibration code.

FIG. 9 is a graph illustrating one example of a digital signal value 962 versus a supply voltage 912 with respect to a calibration code 922. The digital signal value 962 may be one example of the value of a time-to-digital converter (TDC) 114 output. As can be observed from the graph, a digital signal value 962 at a particular supply voltage 912 may vary based on the calibration code 922. During calibration, for example, the circuit 102 (e.g., controller 118) may cycle through the calibration codes 922 until the digital signal value 962 is within a particular range (e.g., 1<digital signal value<16).

In one example, the supply voltage 912 is at 1.05V before calibration (e.g., at a calibration code 922 of '00') and gives a digital signal value 962 of 24. After calibration (with a calibration code 922 of '10,' for example), the digital signal value 962 may be 10 at a supply voltage 912 of 1.05 V.

Figure 10:
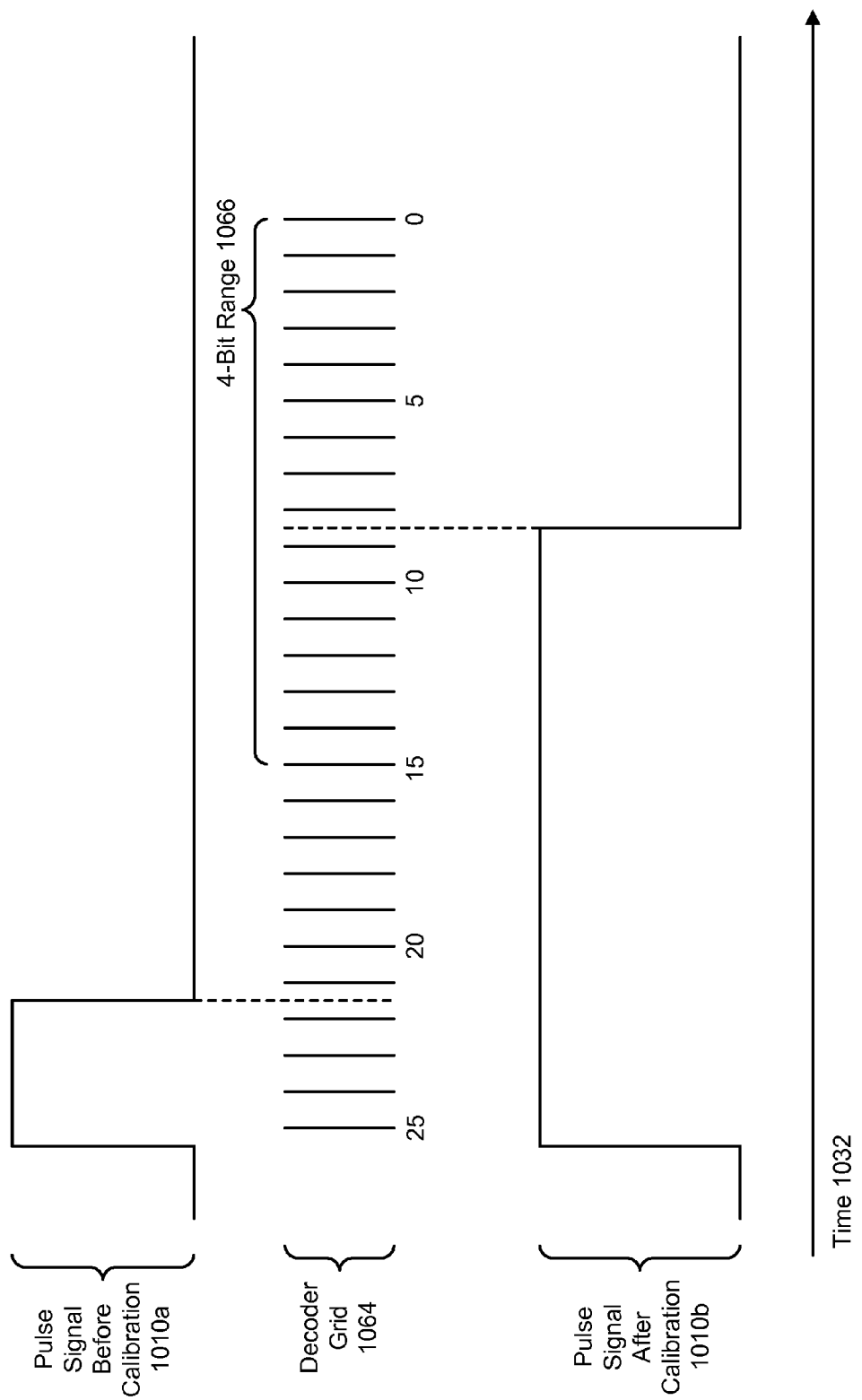
FIG. 10 is a timing diagram illustrating one example of calibrating a supply insensitive pulse generator.

FIG. 10 is a timing diagram illustrating one example of calibrating a supply insensitive pulse generator 108. In particular, FIG. 10 illustrates a pulse signal before calibration 1010*a*, a decoder grid 1064 and a pulse signal after calibration 1010*b* over time 1032. For example, the circuit 102 (e.g., controller 118) may calibrate the supply insensitive pulse generator 108 such that a digital signal 116 from a time-to-digital converter (TDC) is within a 4-bit range 1066.

In this example, the pulse signal before calibration 1010*a* may have a pulse width that corresponds to a digital signal 116 value (for a particular supply voltage 112) that is outside of the 4-bit range 1066. For instance, the pulse signal before calibration 1010*a* may have a pulse width that corresponds to a digital signal 116 value of 22. In this case, the circuit 102 (e.g., controller 118) may increment a calibration code 122 until the pulse signal 1010 width corresponds to a digital signal 116 value (at a particular supply voltage 112) that is within the 4-bit range 1066. In the example illustrated in FIG. 10, the pulse signal after calibration 1010*b* has a pulse width that corresponds to a digital signal 116 value of 9.

Figure 11:
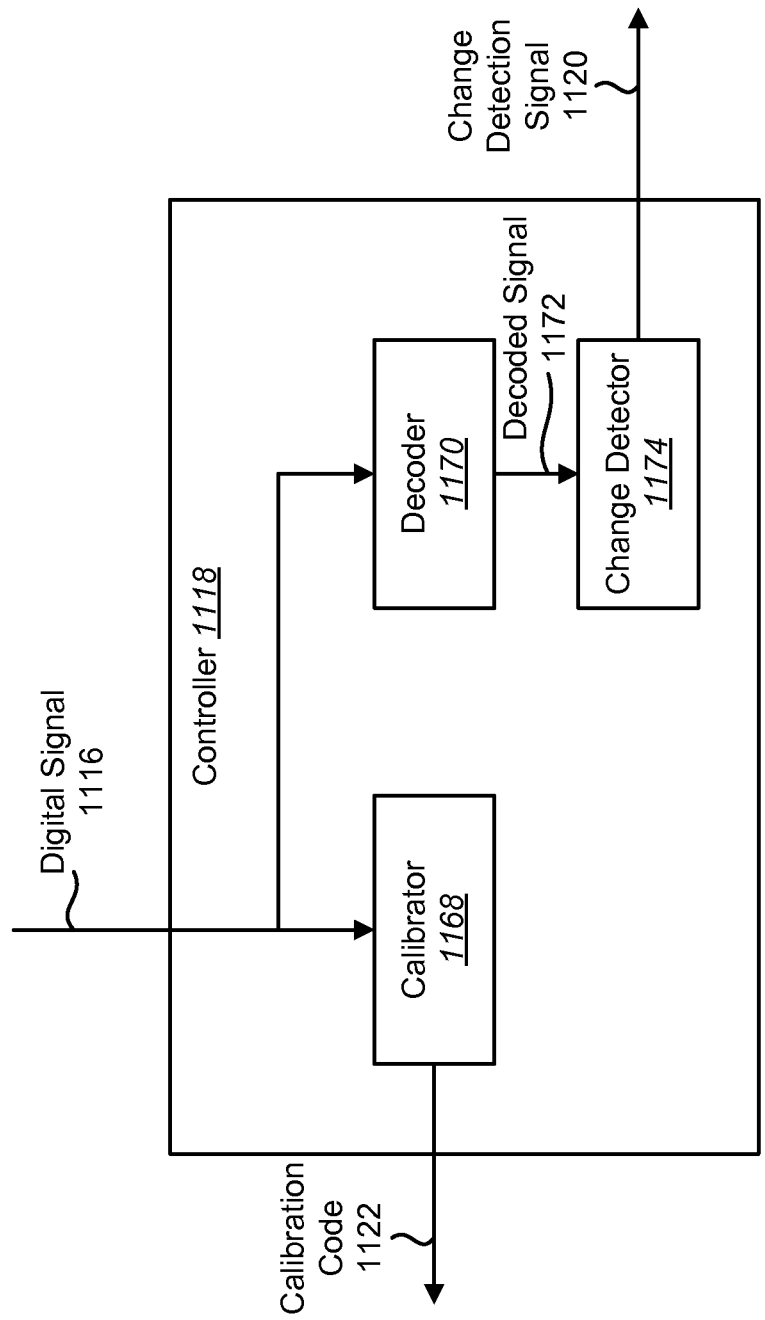
FIG. 11 is a block diagram illustrating one configuration of a controller.

FIG. 11 is a block diagram illustrating one configuration of a controller 1118. The controller 1118 illustrated in FIG. 11 may be one example of the controller 118 illustrated in FIG. 1. The controller 1118 may include a calibrator 1168, a decoder 1170 and a change detector 1174. The controller 1118 may receive a digital signal 1116 and may generate a calibration code 1122 and/or a change detection signal 1120 in response. It should be noted that the controller 1118 and/or the elements of the controller 1118 (e.g., the calibrator 1168, the decoder 1170 and the change detector 1174) may operate based on clock cycles from a clock signal (not shown in FIG. 11).

In one configuration, the digital signal 1116 may be a "thermometer" code. For example, the digital signal 1116 may include a number of bits. The bits may include a series of '1' bits followed by a series of '0' bits or vice-versa. The value of the digital signal 1116 may be represented by the transition position of the bits (from '1' bits to '0' bits or vice-versa, for example). Additionally or alternatively, the value of the digital signal 1116 may be interpreted based on the number of a particular bit (e.g., number of '1' bits or number of '0' bits). For example, the value of the digital signal 1116 may be the total number of bits minus the number of '1' bits. For example, if 26 bits are used to represent the digital signal 1116, of which 17 are '1' bits, then the value of the digital signal may be 9. Continuing with the example, the value of the digital signal 1116 may alternatively be the number of '0' bits. For instance, if there are 9 '0' bits in the digital signal 1116, the value of the digital signal 1116 may be 9. In some configurations, the controller 1118 may receive the digital signal 1116 in a parallel format. For instance, the digital signal 1116 may be provided on 26 wires from 26 D flip-flops in a time-to-digital converter (TDC) 114.

The calibrator 1168 may generate a calibration code 1122 based on the digital signal 1116. For example, the calibrator 1168 may increment a 2-bit calibration code 1122 during calibration, until the digital signal 1116 value is within a particular range (e.g., 2 to 15).

The decoder 1170 may decode the digital signal 1116 into a decoded signal 1172. In one configuration, the controller 1118 may use 4 bits to represent the digital signal 1116 (e.g., the supply voltage 112). For example, the decoder 1170 may convert the digital signal 1116 from a 26-bit signal to a 4-bit decoded signal 1172 for use by the internal logic of the controller 1118. The decoded signal 1172 may be provided to the change detector 1174.

The change detector 1174 may generate a change detection signal 1120 based on the decoded signal 1172. For example, the change detector 1174 may generate a 3-bit change detection signal 1120 based on the difference between the decoded signal 1172 from a prior clock cycle and the decoded signal 1172 at a current clock cycle. For example, if the prior decoded signal 1172 was '1000' (with a value of 8, for example) and the current decoded signal 1172 is '1100' (with a value of 12, for example), then the change detection signal 120 (e.g., "droop code") may be bits '100' (with a value of 4). If another drop in the decoded signal 1172 does not occur for a certain period, if the change in the decoded signal 1172 does not persist for a certain period and/or if the decoded signal 1172 returns to a particular value for a certain period, the change detector may reset the change detection signal 1120.

In some configurations, the change detector 1174 may only indicate a drop in supply voltage 112 (e.g., an increase in the value of the decoded signal 1172) and a reset. After an increase in the decoded signal 1172 value, for instance, if the decoded signal 1172 value decreases (thereby indicating an increase in supply voltage 112), the change detector 1174 may eventually reset the change detection signal 1120. For instance, the change detection signal 120 may be reset if the decoded signal 1172 value decreases (indicating an increase in the supply voltage 112, for example) and does not (again) increase above a particular threshold value (corresponding to a particular supply voltage 112, for example) for a certain period. In some configurations, the change detector 1174 may indicate increases and/or decreases in the value of the decoded signal 1172 (indicating decreases and/or increases in the supply voltage 112).

Figure 12:
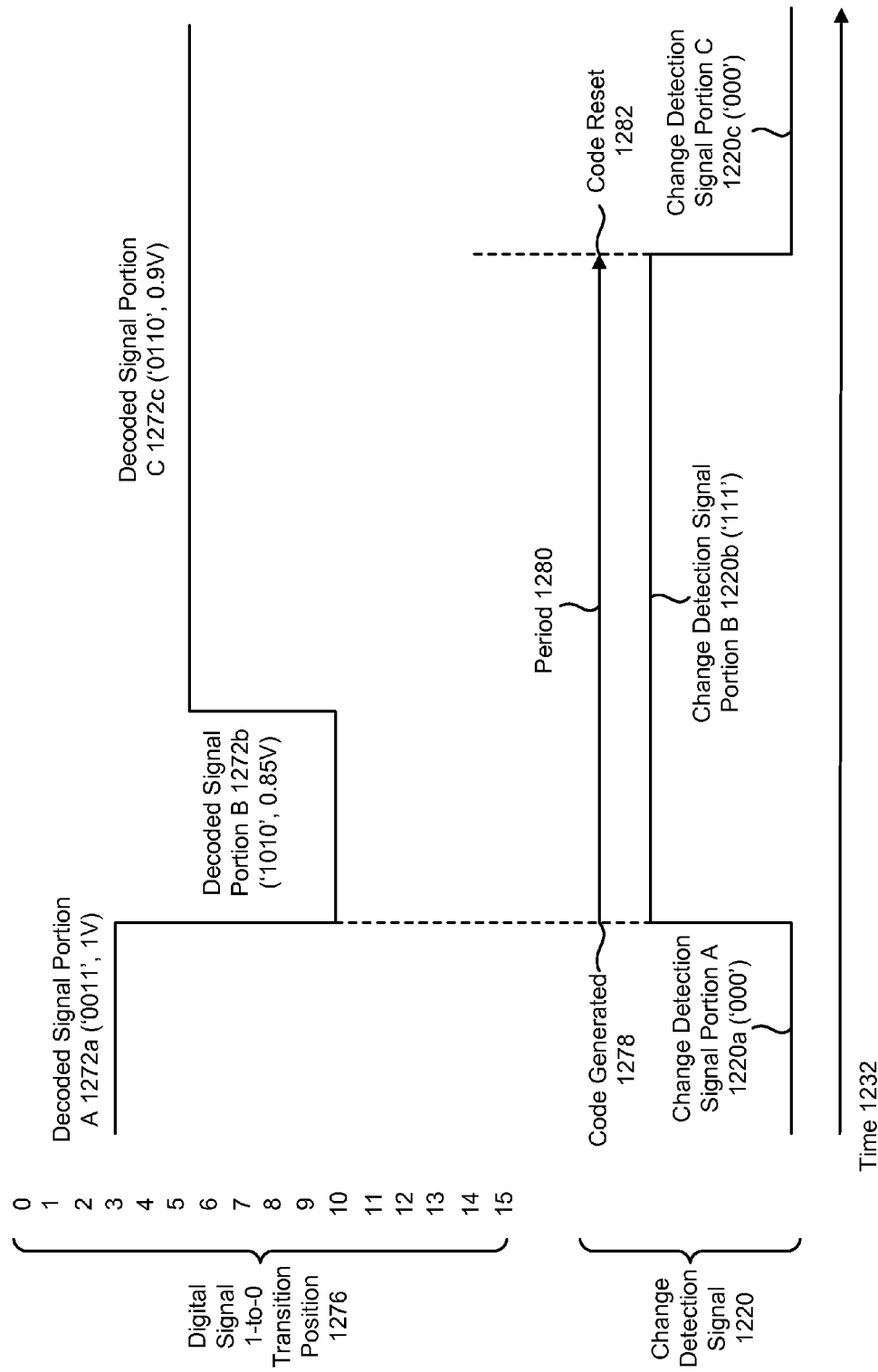
FIG. 12 is a graph illustrating one example of detecting a voltage change.

FIG. 12 is a graph illustrating one example of detecting a voltage change. In particular, FIG. 12 illustrates a plot of a digital signal 1-to-0 transition position 1276 (in the upper plot) and a plot of a change detection signal 1220 over time 1232 (in the lower plot). The digital signal 1-to-0 transition position 1276 is illustrated in terms of when a series of '1' bit(s) transitions to '0' bit(s) (e.g., the number of '0' bits in a digital signal 116 minus 1).

In this example, the upper plot illustrates decoded signal portion A 1272a, decoded signal portion B 1272b and decoded signal portion C 1272c occurring over time 1232. The decoded signal portions 1272a-c may each have a duration of one or more clock cycles. For instance, decoded signal portion A 1272a may remain the same over several clock cycles until the signal changes to decoded signal portion B 1272b. In some configurations, the decoded signal portions 1272a-c may be expressed using four bits. For example, decoded signal portion A 1272a may comprise bits '0011' corresponding to a 3 in transition position 1276 (which may correspond to 1 volt (V) of supply voltage 112, for instance). Additionally, decoded signal portion B 1272b may comprise bits '1010' corresponding to a 10 in transition position 1276 (which may correspond to 0.85 V of supply voltage 112, for instance). Furthermore, decoded signal portion C 1272c may comprise bits '0110' corresponding to a 6 in transition position 1276 (which may correspond to 0.9 V of supply voltage 112, for instance).

In this example, the lower plot illustrates change detection signal portion A 1220a, change detection signal portion B 1220b and change detection signal portion C 1220c occurring over time 1232. The change detection signal portions 1220a-c may each have a duration of one or more clock cycles. In some configurations, the change detection signal portions 1220a-c may comprise a 3-bit code. For example, change detection signal portion A 1220a may be bits '000' and change detection signal portion B 1220b may be bits '111'. Any bit sequence besides '000' may be considered a "droop code" that indicates a supply voltage 112 drop in some configurations.

As illustrated, the digital signal 1-to-0 transition position 1276 may change from 3 to 10, indicating a supply voltage 112 drop from 1 V to 0.85 V (as indicated by an increase in value from decoded signal portion A 1272a bits '0011' to decoded signal portion B 1272b bits '1010'). A code (e.g., droop code) may be generated 1278 when the voltage drops. For example, the controller 118 may generate 1278 a '111' code illustrated by change signal portion B 1220b.

Decoded signal portion C 1272c (e.g., bits '0110') may indicate that no voltage drop has occurred during a period 1280. Once this period 1280 expires, the code may be reset 1282 if no voltage drop occurs. For example, the controller 118 may include a timer (e.g., counter). The controller 118 may start the timer when there is a voltage drop (e.g., an increase in decoded signal 1272 value). If another voltage drop occurs before the end of the period 1280 (e.g., before a certain length of time or number of clock cycles), the controller 118 may restart the timer. However, if the length of the period 1280 is reached without a drop in voltage (as illustrated in FIG. 12), the controller 118 may reset the change detection signal 1220. For example, the change detection signal portion B 1220b (code '111', for example) may be reset 1282 to change detection signal portion A 1220a (code '000', for example).

In some configurations, the change detection signal 1220 may indicate the magnitude of the supply voltage 112 drop. As illustrated in FIG. 12, for example, a value change from decoded signal portion A 1272a (e.g., 3) to decoded signal portion B 1272b (e.g., 10) may be indicated by the change detection signal as '111' (e.g., 7). Other magnitudes of value change (e.g., supply voltage 112 drop) may be indicated by the change detection signal 1220 if they are within a range that can be represented by the number of bits used for the change detection signal 1220, for example.

As illustrated in FIG. 12, the change detection signal 1220 may not indicate increases in supply voltage 112 (e.g., decreases in decoded signal 1272 value) in some configurations. This may allow control (of a PLL, for example) based only on supply voltage 112 drops and not supply voltage 112 transients.

Figure 13:
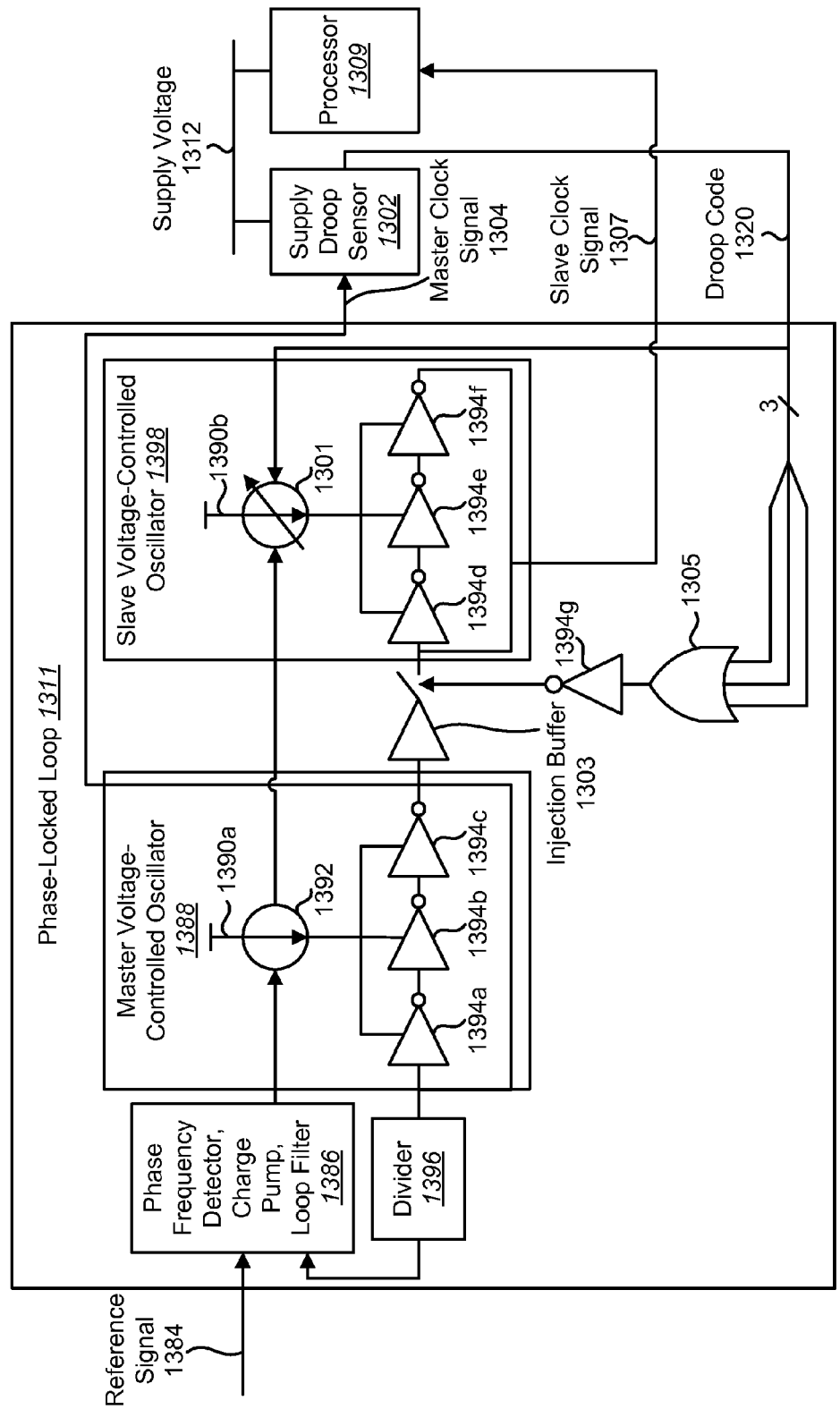
FIG. 13 is a block diagram illustrating one configuration of a phase-locked loop (PLL) and a supply droop sensor.

FIG. 13 is a block diagram illustrating one configuration of a phase-locked loop (PLL) 1311 and a supply droop sensor 1302. The supply droop sensor 1302 illustrated in FIG. 13 may be one example of the circuit 102 illustrated in FIG. 1. In particular, FIG. 13 illustrates how a supply droop sensor 1302 may be applied to a phase-locked loop (PLL) 1311. The phase-locked loop (PLL) 1311 is coupled to the supply droop sensor 1302 and to a processor 1309. In some configurations, the supply droop sensor 1302 may be included within the phase-locked loop (PLL) 1311. In other configurations, the supply droop sensor 1302 may be separate from the phase-locked loop (PLL) 1311.

In this configuration, the phase-locked loop (PLL) 1311 includes a phase frequency detector, charge pump and loop filter 1386, a divider 1396, a master voltage-controlled oscillator (VCO) 1388, a slave voltage-controlled oscillator 1398, an injection buffer 1303, an inverter 1394g and an OR gate 1305. The phase-locked loop (PLL) 1311 may receive a reference signal 1384. The reference signal 1384 may be derived from an oscillating source, such as a crystal. The phase frequency detector, charge pump and loop filter 1386 may generate an output signal that is provided to the master voltage-controlled oscillator (VCO) 1388 based on the reference signal and a divided feedback signal from the divider 1396.

The master voltage-controlled oscillator (VCO) 1388 may include a current source 1392 and inverters 1394a-c. The master voltage-controlled oscillator (VCO) 1388 may be coupled to the injection buffer 1303, to the divider 1396 and to the phase frequency detector, charge pump and loop filter 1386. The master voltage-controlled oscillator (VCO) 1388 may generate a master clock signal 1304 that is provided to a supply droop sensor 1302 based on a voltage 1390a and the output signal from the phase frequency detector, charge pump and loop filter 1386. The master clock signal 1304 is also provided to the divider 1396 and to the injection buffer 1303. The master voltage-controlled oscillator (VCO) 1388 may also generate an output signal that is provided to the slave voltage-controlled oscillator (VCO) 1398.

The slave voltage-controlled oscillator (VCO) 1398 may include a variable current source 1301 and inverters 1394d-f. The slave voltage-controlled oscillator (VCO) 1398 may be coupled to the processor 1309. The slave voltage-controlled oscillator (VCO) 1398 may optionally be coupled to the injection buffer 1303 through a switch. The slave voltage-controlled oscillator (VCO) 1398 may generate a slave clock signal 1307 that is provided to the processor 1309 based on a voltage 1390b and the output signal from the master voltage-controlled oscillator (VCO) 1388. The slave clock signal 1307 may control the frequency at which the processor 1309 operates.

As illustrated, the supply droop sensor 1302 and the processor 1309 are both coupled to a supply voltage 1312. It should be noted that the supply voltage 1312 may be different from the voltages 1390a-b (e.g., may be from a different voltage supply) used to power the voltage-controlled oscillators (VCOs) 1388, 1398. The supply droop sensor 1302 (e.g., circuit 102) may generate a droop code 1320 (e.g., a change detection signal 120) when the supply voltage 1312 drops.

As described above, the processor 1309 may not be able to adequately perform operations at a particular (higher) frequency when the supply voltage 1312 drops. For example, the processor 1309 may provide erroneous outputs or may fail to operate at a particular (higher) frequency if the supply voltage 1312 drops a particular amount. The droop code 1320 provided by the supply droop sensor 1302 may include three bits that are provided to the OR gate 1305 and to the variable current source 1301. In the case that the supply voltage 1312 has not dropped (e.g., the droop code is '000'), the OR gate 1305 and the inverter 1394g may control the switch in order to close the switch at the injection buffer 1303. The injection buffer 1303 provides an injection signal to the slave voltage-controlled oscillator 1398 such that the slave clock signal 1307 is equivalent to the master clock signal 1304. However, if the droop code 1320 indicates that the supply voltage 1312 has dropped (e.g., the droop code 1320 contains one or more '1' bits), the switch may be opened. This switches off the injection signal. In this case, the droop code 1320 also controls the variable current source 1301 in order to reduce the frequency of the slave clock signal 1307. Thus, the processor 1309 may operate at a slower frequency. In this way, the processor 1309 may operate correctly even when the supply voltage 1312 drops (due to increased loading, for example).

The systems and methods disclosed herein may allow a reduction in processor clock (e.g., slave clock signal 1307) frequency only with supply voltage 1312 droops and not with overshoots. This may be advantageous since the phase-locked loop (PLL) 1311 may be used to clock multiple digital blocks all rated for a certain maximum frequency. Some of these digital blocks may be on a different supply than the processor 1309. So, when the phase-locked loop (PLL) 1311 drops the slave clock signal 1307 frequency in response to a drop on the supply voltage, these digital blocks may not be affected. Otherwise (e.g., if the phase-locked loop (PLL) 1311 responded to an overshoot on the supply voltage 1312 and increased a clock frequency above a maximum frequency), these other digital blocks could fail. Another beneficial feature of the systems and methods disclosed herein is that the injection locked master-slave voltage-controlled oscillators (VCOs) 1388, 1398 in combination with the supply droop sensor may ensure that the slave clock signal 1307 relocks to the master clock signal 1304 with no overshoot after a droop event has passed. In other prior art schemes, a PLL may try to relock once the supply transient has passed and there may be overshoot in PLL frequency based on the PLL loop dynamics.

Figure 14:
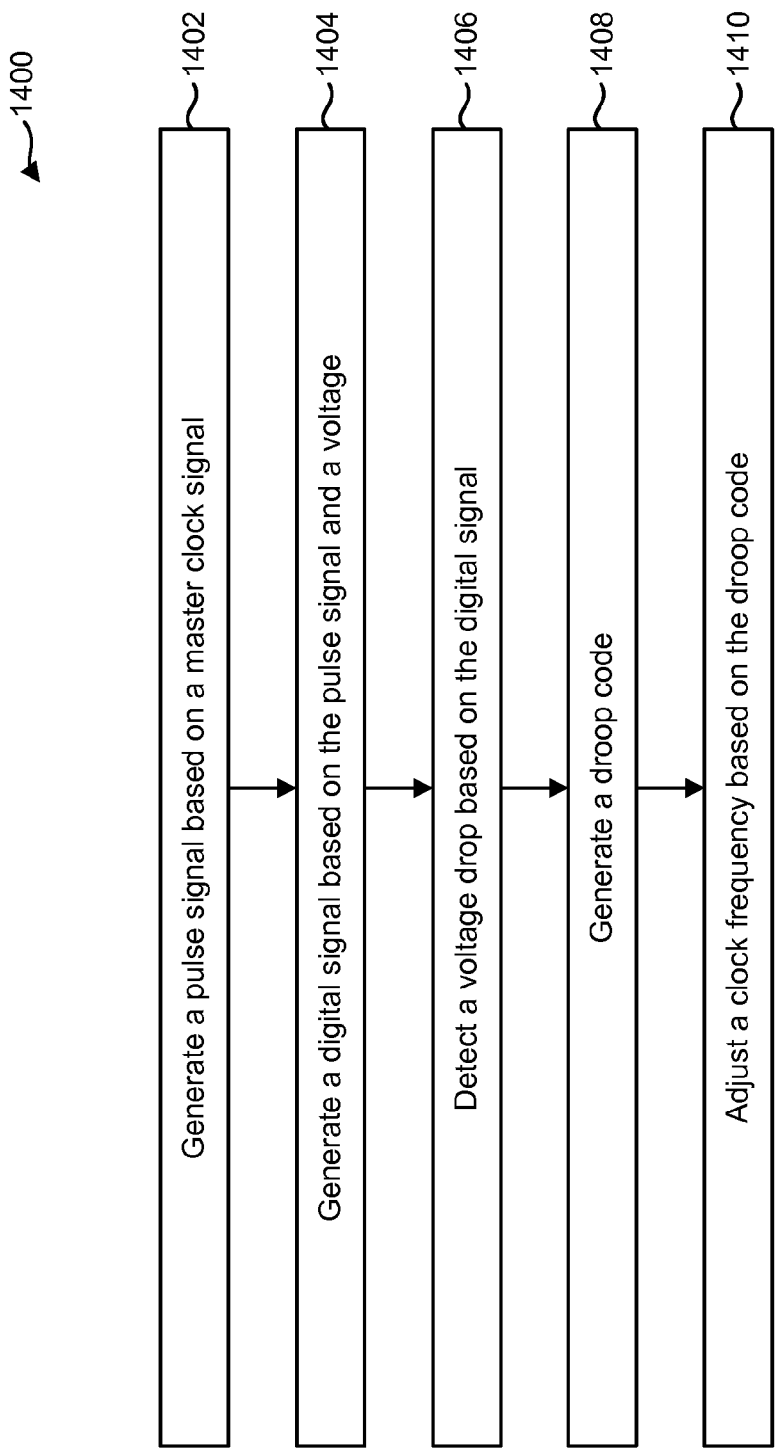
FIG. 14 is a flow diagram illustrating a more specific configuration of a method for detecting a voltage change.

FIG. 14 is a flow diagram illustrating a more specific configuration of a method 1400 for detecting a voltage change. The supply droop sensor 1302 may generate 1402 a pulse signal based on a master clock signal 1304. For example, a supply insensitive pulse generator in the supply droop sensor 1302 may generate a pulse width in the pulse signal at each cycle of the master clock signal 1304 (or a frequency-divided version of the master clock signal 1304, for example).

The supply droop sensor 1302 may generate 1404 a digital signal based on the pulse signal and a voltage 1312. For example, a time-to-digital converter (TDC) in the supply droop sensor 1302 may generate 1404 a digital signal (e.g., a "thermometer signal") based on the pulse signal and the supply voltage 1312. As described above, the digital signal may indicate or reflect variations in the supply voltage 1312.

The supply droop sensor 1302 may detect 1406 a voltage drop (e.g., a drop in the supply voltage 1312) based on the digital signal. For example, the supply droop sensor 1302 may detect when the digital signal represents a longer delay (and hence, a lower supply voltage 1312) than was previously indicated.

The supply droop sensor 1302 may generate 1408 a droop code 1320. For example, the supply droop sensor 1302 may generate a 3-bit droop code 1320 when a voltage drop is detected 1406.

The supply droop sensor 1302 may adjust 1410 a clock frequency (e.g., a slave clock 1307 frequency) based on the droop code 1320. For example, the droop code 1320 may cause an injection buffer 1303 to open a switch between a master voltage-controlled oscillator 1388 and a slave voltage-controlled oscillator 1398. The droop code 1320 may also control a variable current source 1301 in order to lower the frequency of the slave clock 1307 (e.g., a processor clock). The resulting slave clock 1307 frequency may be based on the magnitude of the droop code 1320. For example, a smaller supply voltage 1312 droop may lead to a smaller droop code 1320 magnitude, which may lower the frequency of the slave clock 1307 less than a larger supply voltage 1312 droop.

Figure 15:
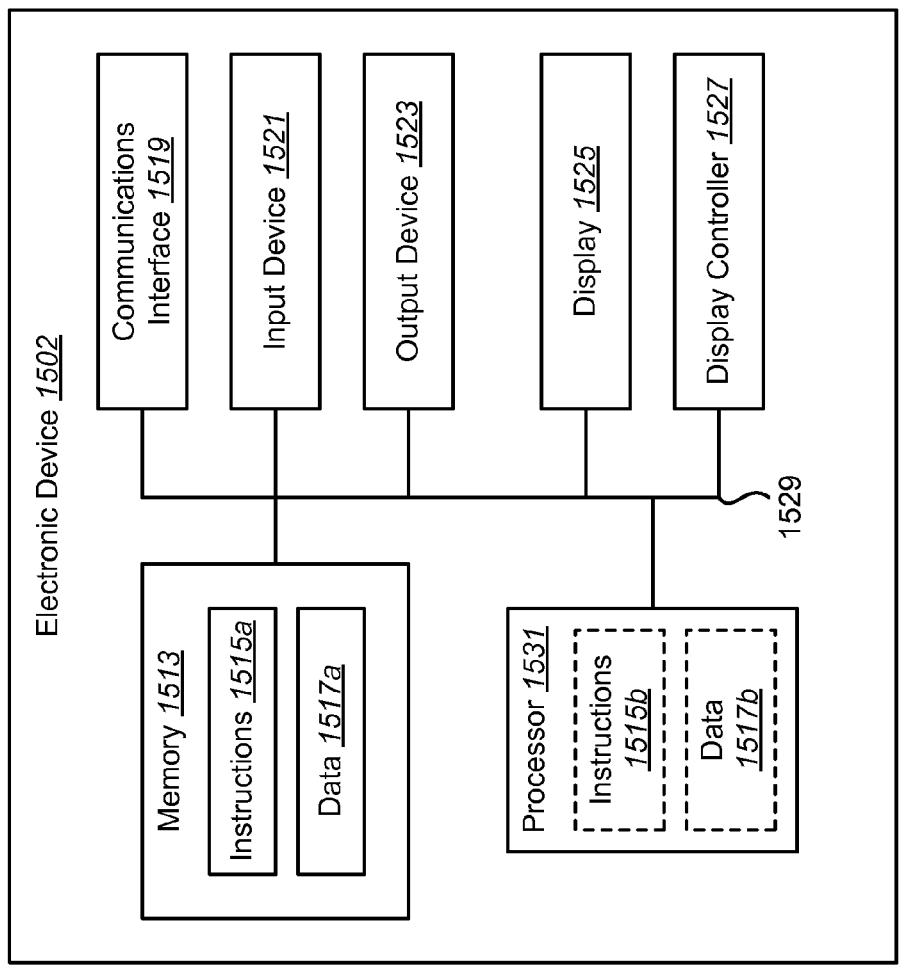
FIG. 15 illustrates various components that may be utilized in an electronic device.

FIG. 15 illustrates various components that may be utilized in an electronic device 1502. The illustrated components may be located within the same physical structure or in separate housings or structures. Examples of electronic devices 1502 may include cellular phones, smartphones, computers, televisions, etc. The electronic device 1502 may be configured similarly to the circuit 102 and/or similarly to the supply droop sensor 1302 (optionally in conjunction with the phase-locked-loop 1311 and/or the processor 1309) described previously. The electronic device 1502 includes a processor 1531. The processor 1531 may be a general purpose single- or multi-chip microprocessor (e.g., an ARM), a special purpose microprocessor (e.g., a digital signal processor (DSP)), a microcontroller, a programmable gate array, etc. The processor 1531 may be referred to as a central processing unit (CPU). Although just a single processor 1531 is shown in the electronic device 1502 of FIG. 15, in an alternative configuration, a combination of processors (e.g., an ARM and DSP) could be used.

The electronic device 1502 also includes memory 1513 in electronic communication with the processor 1531. That is, the processor 1531 can read information from and/or write information to the memory 1513. The memory 1513 may be any electronic component capable of storing electronic information. The memory 1513 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1517a and instructions 1515a may be stored in the memory 1513. The instructions 1515a may include one or more programs, routines, sub-routines, functions, procedures, etc. The instructions 1515a may include a single computer-readable statement or many computer-readable statements. The instructions 1515a may be executable by the processor 1531 to implement one or more of the methods 200, 800, 1400 described above. Executing the instructions 1515a may involve the use of the data 1517a that is stored in the memory 1513. FIG. 15 shows some instructions 1515b and data 1517b being loaded into the processor 1531 (which may come from instructions 1515a and data 1517a).

The electronic device 1502 may also include one or more communication interfaces 1519 for communicating with other electronic devices. The communication interfaces 1519 may be based on wired communication technology, wireless communication technology, or both. Examples of different types of communication interfaces 1519 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, an IEEE 802.11 wireless communication adapter and so forth.

The electronic device 1502 may also include one or more input devices 1521 and one or more output devices 1523. Examples of different kinds of input devices 1521 include a keyboard, mouse, microphone, remote control device, button, joystick, trackball, touchpad, lightpen, etc. Examples of different kinds of output devices 1523 include a speaker, printer, etc. One specific type of output device which may be typically included in an electronic device 1502 is a display device 1525. Display devices 1525 used with configurations disclosed herein may utilize any suitable image projection technology, such as a cathode ray tube (CRT), liquid crystal display (LCD), light-emitting diode (LED), gas plasma, electroluminescence, or the like. A display controller 1527 may also be provided, for converting data stored in the memory 1513 into text, graphics, and/or moving images (as appropriate) shown on the display device 1525.

The various components of the electronic device 1502 may be coupled together by one or more buses, which may include a power bus, a control signal bus, a status signal bus, a data bus, etc. For simplicity, the various buses are illustrated in FIG. 15 as a bus system 1529. It should be noted that FIG. 15 illustrates only one possible configuration of an electronic device 1502. Various other architectures and components may be utilized.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any non-transitory tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 2, FIG. 8 and FIG. 14, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A circuit for detecting a voltage change, comprising:
    a supply insensitive pulse generator that generates a pulse signal;
    a time-to-digital converter coupled to the supply insensitive pulse generator, wherein the time-to-digital converter generates a digital signal based on the pulse signal and a voltage; and
    a controller coupled to the time-to-digital converter that detects a voltage change based on the digital signal.

2. The circuit of claim 1, wherein the controller generates a droop code only when the voltage change is a voltage drop.

3. The circuit of claim 2, wherein the controller resets the droop code if no additional voltage drop occurs within a period.

4. The circuit of claim 1, wherein the controller is coupled to a phase-locked loop that generates a clock signal for a processor, and wherein the controller adjusts a frequency of the clock signal based on the voltage change.

5. The circuit of claim 4, wherein the controller adjusts the frequency of the clock signal by switching off an injection signal from a slave voltage-controlled oscillator and adjusting a variable current source.

6. The circuit of claim 1, wherein the controller generates a calibration code to adjust the pulse signal from the supply insensitive pulse generator.

7. The circuit of claim 6, wherein the controller generates the calibration code by incrementing the calibration code until the digital signal is within a range.

8. The circuit of claim 1, wherein the supply insensitive pulse generator generates the pulse signal based on a frequency-divided clock signal.

9. The circuit of claim 1, wherein the digital signal comprises a thermometer code.

10. The circuit of claim 9, wherein the controller comprises a decoder that decodes the thermometer code into a 4-bit number.

11. A method for detecting a voltage change by a circuit, comprising:
    generating a pulse signal by a supply insensitive pulse generator;
    generating a digital signal by a time-to-digital converter based on the pulse signal and a voltage; and
    detecting a voltage change based on the digital signal.

12. The method of claim 11, further comprising generating a droop code only when the voltage change is a voltage drop.

13. The method of claim 12, further comprising resetting the droop code if no additional voltage drop occurs within a period.

14. The method of claim 11, further comprising adjusting a frequency of a clock signal for a processor based on the voltage change.

15. The method of claim 14, wherein adjusting the frequency of the clock signal comprises switching off an injection signal from a slave voltage-controlled oscillator and adjusting a variable current source.

16. The method of claim 11, further comprising generating a calibration code to adjust the pulse signal from the supply insensitive pulse generator.

17. The method of claim 16, wherein generating the calibration code comprises incrementing the calibration code until the digital signal is within a range.

18. The method of claim 11, wherein the pulse signal is generated based on a frequency-divided clock signal.

19. The method of claim 11, wherein the digital signal comprises a thermometer code.

20. The method of claim 19, further comprising decoding the thermometer code into a 4-bit number.

21. A computer-program product for detecting a voltage change, comprising a non-transitory tangible computer-readable medium having instructions thereon, the instructions comprising:
    code for causing a circuit to generate a pulse signal by a supply insensitive pulse generator;
    code for causing the circuit to generate a digital signal by a time-to-digital converter based on the pulse signal and a voltage; and
    code for causing the circuit to detect a voltage change based on the digital signal.

22. The computer-program product of claim 21, the instructions further comprising code for causing the circuit to generate a droop code only when the voltage change is a voltage drop.

23. The computer-program product of claim 22, the instructions further comprising code for causing the circuit to reset the droop code if no additional voltage drop occurs within a period.

24. The computer-program product of claim 21, the instructions further comprising code for causing the circuit to adjust a frequency of a clock signal for a processor based on the voltage change.

25. The computer-program product of claim 21, the instructions further comprising code for causing the circuit to generate a calibration code to adjust the pulse signal from the supply insensitive pulse generator.

26. An apparatus for detecting a voltage change, comprising:
- means for generating a pulse signal that is insensitive to variations in supply voltage;
- means for generating a digital signal based on the pulse signal and a voltage; and
- means for detecting a voltage change based on the digital signal.

27. The apparatus of claim 26, further comprising means for generating a droop code only when the voltage change is a voltage drop.

28. The apparatus of claim 27, further comprising means for resetting the droop code if no additional voltage drop occurs within a period.

29. The apparatus of claim 26, further comprising means for adjusting a frequency of a clock signal for a processor based on the voltage change.

30. The apparatus of claim 26, further comprising means for generating a calibration code to adjust the pulse signal.

* * * * *